(12) United States Patent
Kobayashi et al.

(10) Patent No.: US 12,094,798 B2
(45) Date of Patent: Sep. 17, 2024

(54) POWER SEMICONDUCTOR DEVICE INCLUDING A DEFORMABLE FLOW BLOCKING MEMBER BETWEEN A MODULE UNIT AND A COOLING UNIT

(71) Applicant: Mitsubishi Electric Corporation, Tokyo (JP)

(72) Inventors: Hiroshi Kobayashi, Tokyo (JP); Tomohisa Yamane, Tokyo (JP); Shinnosuke Soda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 235 days.

(21) Appl. No.: 17/618,886

(22) PCT Filed: Aug. 26, 2019

(86) PCT No.: PCT/JP2019/033313
§ 371 (c)(1),
(2) Date: Dec. 14, 2021

(87) PCT Pub. No.: WO2021/038688
PCT Pub. Date: Mar. 4, 2021

(65) Prior Publication Data
US 2022/0359336 A1    Nov. 10, 2022

(51) Int. Cl.
*H01L 23/367* (2006.01)
*H01L 21/02* (2006.01)
(Continued)

(52) U.S. Cl.
CPC ........ *H01L 23/36* (2013.01); *H01L 21/02304* (2013.01); *H01L 23/10* (2013.01);
(Continued)

(58) Field of Classification Search
CPC ... H01L 21/02304; H01L 23/36; H01L 23/10; H01L 23/3142; H01L 23/367;
(Continued)

(56) References Cited

U.S. PATENT DOCUMENTS

2005/0230816 A1* 10/2005 Kurauchi ............ H01L 23/4334
  257/E23.092
2013/0270684 A1* 10/2013 Negishi ................... H01L 24/27
  174/257
(Continued)

FOREIGN PATENT DOCUMENTS

DE    11 2019 007 574 T5    1/2022
JP        2012-174965 A      9/2012
(Continued)

OTHER PUBLICATIONS

International Search Report and Written Opinion mailed on Nov. 12, 2019, received for PCT Application PCT/JP2019/033313, Filed on Aug. 26, 2019, 6 pages including English Translation.
German Office Action issued Feb. 23, 2024, in corresponding German Patent Application No. 11 2019 007 669.8, 16pp.

*Primary Examiner* — Alonzo Chambliss
(74) *Attorney, Agent, or Firm* — XSENSUS LLP

(57) ABSTRACT

Provided is a semiconductor device that prevents resin from leaking out from a resin insulating member at a periphery of the resin insulating member and thereby achieves an increase in reliability. The semiconductor device includes a module unit, a resin insulating member bonded to the module unit, a cooling unit coupled to the module unit with the resin insulating member interposed therebetween, and a flow blocking member disposed between the module unit and the cooling unit to surround the resin insulating member, the flow blocking member being more easily compressively deformable than the resin insulating member.

18 Claims, 14 Drawing Sheets

(51) Int. Cl.
*H01L 23/00* (2006.01)
*H01L 23/10* (2006.01)
*H01L 23/31* (2006.01)
*H01L 23/36* (2006.01)
*H01L 23/46* (2006.01)
*H01L 25/07* (2006.01)

(52) U.S. Cl.
CPC ...... *H01L 23/3107* (2013.01); *H01L 23/3142* (2013.01); *H01L 23/367* (2013.01); *H01L 23/46* (2013.01); *H01L 24/26* (2013.01); *H01L 25/07* (2013.01); *H01L 2924/181* (2013.01)

(58) Field of Classification Search
CPC ......... H01L 23/46; H01L 25/07; H01L 24/26; H01L 2924/181; H01L 2924/13091; H01L 2924/13055; H01L 23/3107
See application file for complete search history.

(56) References Cited

U.S. PATENT DOCUMENTS

| | | | |
|---|---|---|---|
| 2020/0043824 A1* | 2/2020 | Tada | ............ H01L 23/40 |
| 2022/0310478 A1 | 9/2022 | Nishimura et al. | |
| 2023/0154820 A1* | 5/2023 | Yamane | ............ H01L 25/07 |
| | | | 257/707 |

FOREIGN PATENT DOCUMENTS

| | | | | |
|---|---|---|---|---|
| JP | 2013110181 A | * | 6/2013 | ............ H01L 24/33 |
| JP | 5379816 B2 | * | 12/2013 | ............ H01L 24/34 |
| JP | 5484429 B2 | * | 5/2014 | ............ H01L 24/33 |
| JP | 2017092056 A | * | 5/2017 | |
| JP | 2018026370 A | * | 2/2018 | ............ H01L 23/12 |
| WO | WO-2013099545 A1 | * | 7/2013 | ........ H01L 23/3107 |
| WO | WO-2016076015 A1 | * | 5/2016 | ............ H01L 23/12 |

\* cited by examiner

POWER SEMICONDUCTOR DEVICE INCLUDING A DEFORMABLE FLOW BLOCKING MEMBER BETWEEN A MODULE UNIT AND A COOLING UNIT

CROSS-REFERENCE TO RELATED APPLICATION

The present application is based on PCT filing PCT/JP2019/033313, filed Aug. 26, 2019, the entire contents of which are incorporated herein by reference.

TECHNICAL FIELD

The present invention relates to a power semiconductor device including a power module in which a power semiconductor element is sealed and a heat dissipation member with a thermally conductive resin insulating layer interposed between the power module and the heat dissipation member, a method for manufacturing a power semiconductor device, and a power conversion device.

BACKGROUND ART

For power modules, heat dissipation is one of the critical challenges. As one of the solutions, power semiconductor devices in which a thermally conductive resin insulating layer serving as a bonding agent, an electrical insulator, and a thermal conductor is disposed between a heat sink that is a heat dissipation member and a power module have been put to practical use. Examples of the thermally conductive resin insulating layer include a thermosetting resin sheet containing an inorganic filler, an inorganic molded body sheet impregnated with a thermosetting resin, a coating film, and the like. Application of heat and pressure to such a thermally conductive resin insulating layer causes the thermally conductive resin insulating layer to serve as a bonding agent to bond the power module and the heat sink together.

Upon application of heat, the thermally conductive resin insulating layer becomes softer before the resin is cured, and then the resin flows upon application of pressure to reduce voids that are originally present, thereby achieving desired electrical insulation. The application of pressure, however, causes a force to act on the end of the thermally conductive resin insulating layer to cause main to leak out from the end, that is, the flow of resin to occur. At this time, the flow of resin occurs around the end of the thermally conductive resin insulating layer, resin to fill the voids becomes insufficient, and, as a result, the voids are not sufficiently reduced, or a plurality of voids are coupled together to become a larger void, which may fail to achieve desired electrical insulation.

Therefore, in order to solve this problem, a thickness restricting member for a thermally conductive resin insulating sheet is provided to restrict the thickness of the thermally conductive resin insulating sheet, thereby restraining the amount of resin leaking out from the thermally conductive insulating resin sheet upon application of pressure (for example, PTL 1).

CITATION LIST

Patent Literature

PTL 1: Japanese Patent Laying-Open No. 2012-174965

SUMMARY OF INVENTION

Technical Problem

In the power semiconductor device described in PTL 1, the thickness restricting member for the thermally conductive insulating resin sheet is provided to make the thickness of the thermally conductive insulating rain sheet equal to a desired thickness upon application of pressure, but it is not possible to prevent resin from flowing out from the thermally conductive insulating resin sheet upon application of pressure, voids are generated around the end of the thermally conductive insulating resin sheet, so that electrical insulation is not highly enough, and the reliability of the power semiconductor device may be deteriorated accordingly.

The present invention has been made to solve the problem as described above, and it is therefore an object of the present invention to provide a power semiconductor device that prevents main from flowing out from a thermally conductive insulating resin sheet upon application of pressure and has electrical insulation so as to achieve higher reliability.

Solution to Problem

A power semiconductor device according to the present invention includes a module unit, a resin insulating member bonded to the module unit, a cooling unit coupled to the module unit with the resin insulating member interposed therebetween, and a flow blocking member disposed between the module unit and the cooling unit to surround the resin insulating member, the flow blocking member being more easily compressively deformable than the resin insulating member.

Advantageous Effects of Invention

According to the present invention, the flow blocking member is provided around the resin insulating member, so that it is possible to suppress generation of voids around the end of the resin insulating member and make the reliability of the power semiconductor device higher.

DESCRIPTION OF EMBODIMENTS

Figure 1:
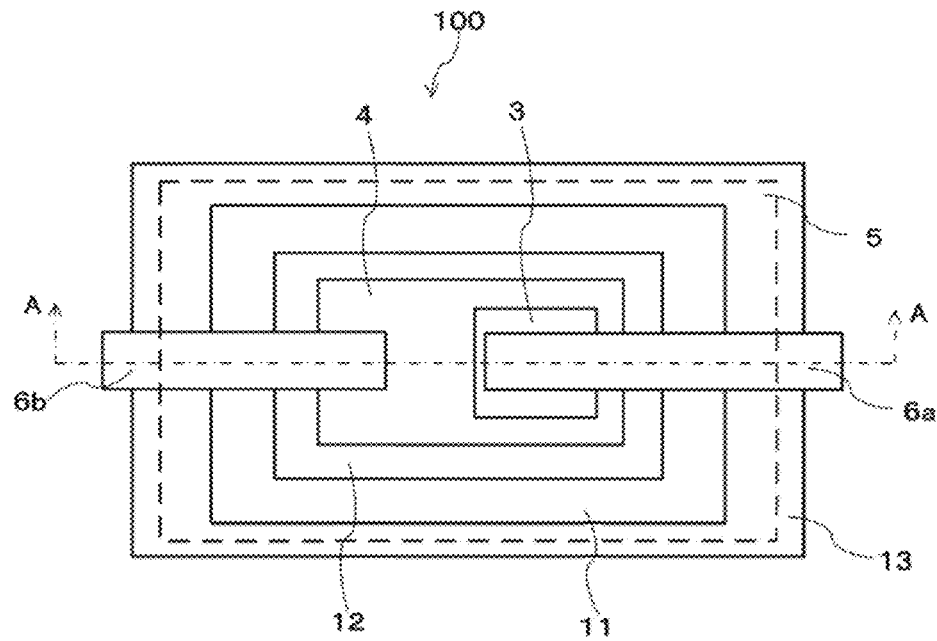
FIG. 1 is a plan structure view schematically illustrating a power semiconductor device according to a first embodiment of the present invention.

First, an overall structure of a power semiconductor device according to the present invention will be described with reference to the drawings. It should be noted that the drawings are schematic representations and do not show the correct sizes of given components. Further, components denoted by the same reference numerals are identical or equivalent to each other, and this applies to the entire specification.

First Embodiment

Figure 2:
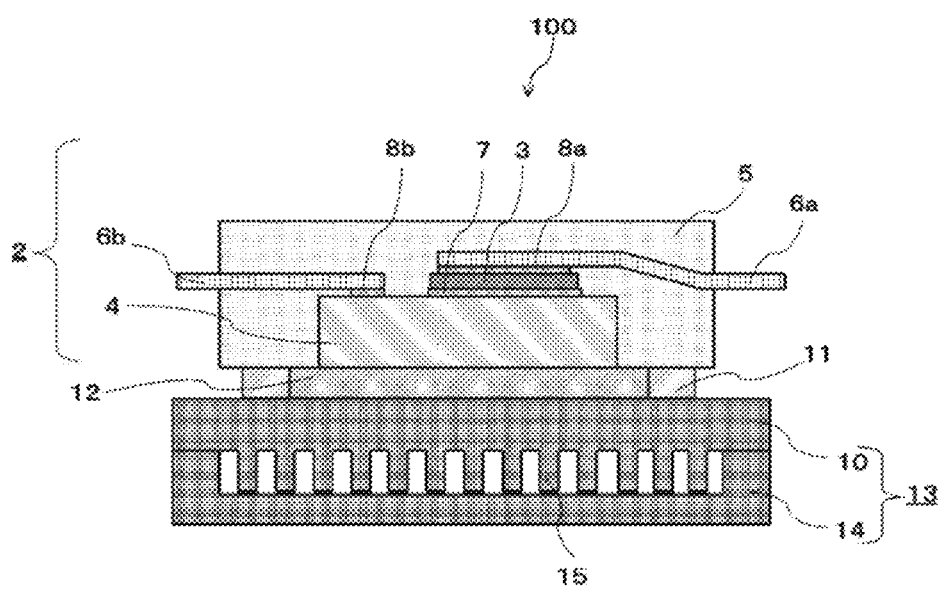
FIG. 2 is a cross-sectional structure view schematically illustrating the power semiconductor device according to the first embodiment of the present invention.

FIG. 1 is a plan structure view schematically illustrating a power semiconductor device according to the first embodiment of the present invention. FIG. 2 is a cross-sectional structure view schematically illustrating the power semiconductor device according to the first embodiment of the present invention. FIG. 1 is a plan structure view schematically illustrating a power semiconductor device 100 as viewed from above through a scaling member 5. FIG. 2 is a schematic cross-sectional structure view taken along a long dashed short dashed line AA in FIG. 1.

In the drawings, power semiconductor device 100 includes a module unit 2, a cooling unit 13, a resin insulating member 12, and a flow blocking member 11. Further, module unit 2 includes a power semiconductor element 3, an electrically conductive member 4 having a plate shape, input/output terminals 6a, 6b, a bonding agent 7, 8a, 8b, and sealing member 5. Further, cooling unit 13 includes a heat sink 10, fins 15, and a water jacket 14.

In the drawings, in power semiconductor device 100, module unit 2 and cooling unit 13 are coupled together with resin insulating member 12 interposed therebetween. Flow prevention member 11 is disposed around resin insulating member 12 to surround resin insulating member 12 and between module unit 2 and cooling unit 13.

In FIG. 1, sealing member 5 is represented by a dotted line so as to show a positional relationship among members scaled in sealing member 5. The outermost periphery of power semiconductor device 100 coincides with the edge of cooling unit 13. Scaling member 5 (module unit 2) is disposed inside the edge of cooling unit 13. Further, flow blocking member 11 is disposed inside the periphery of scaling member 5 and outside the periphery of resin insulating member 12. Further, resin insulating member 12 is larger in outline dimensions than electrically conductive member 4, and electrically conductive member 4 is disposed inside the periphery of resin insulating member 12. Power semiconductor element 3 and input/output terminal 6b am arranged on the upper surface of electrically conductive member 4. Input/output terminal 6a is disposed on an upper electrode provided on the upper surface of power semiconductor element 3.

In FIG. 2, a lower electrode (not illustrated) provided on the lower surface of power semiconductor element 3 is electrically bonded to the upper surface of electrically conductive member 4 having a plate shape via (by) bonding agent 7. Further, input/output terminal 6b is electrically bonded to the upper surface of electrically conductive member 4 having a plate shape via bonding agent 8b. Further, the upper electrode (not illustrated) provided on the upper surface of power semiconductor element 3 is electrically bonded to input/output terminal 6a via bonding agent 8a. In sealing member 5, power semiconductor element 3, electrically conductive member 4, and input/output terminals 6a, 6b are sealed with a heat dissipation surface that is the lower surface of electrically conductive member 4 having a plate shape exposed, one end of each of input/output terminals 6a, 6b exposed from sealing member 5, and the other end placed inside sealing member 5. The lower surface of electrically conductive member 4 exposed from sealing member 5 is disposed on (coupled to) the upper surface of cooling unit 13 (the upper surface of beat sink 10) with resin insulating member 12 interposed between the lower surface and the upper surface.

Flow prevention member 11 and resin insulating member 12 satisfy a relationship of $E_{seal} < E_{seat}$ where $E_{seal}$ represents resistance against compression of flow blocking member 11, and $E_{seat}$ represents resistance against compression of resin insulating member 12. In other words, the resistance against compression of flow blocking member 11 is set smaller than the resistance against compression of rain insulating member 12. Here, resistance E against compression is expressed by $E = \sigma_c / \varepsilon$ where $\sigma_c$ represents compression stress, and $\varepsilon$ represents compression strain. Such compressive deformation includes elastic deformation, plastic deformation, rubber elasticity, or a combination thereof.

Next, a structure, material, and material property of each component will be described.

First, components constituting module unit 2 will be described.

Power semiconductor element 3 has an upper surface and a lower surface. Power semiconductor element 3 has the upper electrode provided on the upper surface and has the lower electrode provided the lower surface. Input/output terminal 6a is bonded to the upper electrode of power semiconductor element 3 via bonding agent 8a. Examples of the device structure of power semiconductor element 3 include an insulated gate bipolar transistor (IGBT), a metal oxide semiconductor field effect transistor (MOSFET), a bipolar transistor, and a diode, and examples of the substrate material include wide gap semiconductors such as silicon (Si), silicon carbide (SiC), gallium nitride (GaN), and gallium oxide (GaO).

Electrically conductive member 4 is a plate-like member. Electrically conductive member 4 has an upper surface and a lower surface. Power semiconductor element 3 and input/output terminal 6b are bonded to the upper surface of electrically conductive member 4 by bonding agent 7, 8b. Electrically conductive member 4 is made of a material excellent in both electrical conductivity and thermal conductivity, such as copper (Cu), aluminum (Al), an alloy mainly composed of copper or aluminum, or a carbon-based material such as carbon nanotubes or graphite. Further, the surface of electrically conductive member 4 may be subjected to a surface treatment such as Ni—P plating.

In sealing member 5, power semiconductor element 3, electrically conductive member 4, and input/output terminals 6a, 6b are sealed with the heat dissipation surface that is the lower surface of electrically conductive member 4 having a plate shape exposed, one end of each of input/output terminals 6a, 6b exposed from a side of sealing member 5, and the other end placed inside sealing member 5. Scaling member 5 is formed by transfer molding of an epoxy resin containing filler such as silica.

Input/output terminals 6a, 6b electrically couple the inside and outside of module unit 2. Input/output terminals 6a, 6b are made of a highly conductive material such as copper. Two or more input/output terminals 6a, 6b may be provided in a manner that depends on a circuit structure of module unit 2.

Power semiconductor element 3 and electrically conductive member 4 are bonded together by bonding agent 7. Bonding agent 7 is also referred to as a die bonding agent, a die attach agent, or an under-chip bonding agent, and it is important that bonding agent 7 is excellent in electrical conductivity and thermal conductivity, and mechanical reliability against thermal load and impact. As a material of bonding agent 7, Sn-based solder is commonly used, but in recent yeas, sintered Ag or sintered Cu using nanoparticles, transient liquid phase diffusion (TLP) bonding, and the like are also used, and the material of bonding agent 7 can be appropriately selected from the viewpoint of a balance between performance and cost. Further, the bonding between power semiconductor element 3 and electrically conductive member 4 having a plate shape may be, for example, direct bonding between power semiconductor element 3 and electrically conductive member 4 having a plate shape with no explicit bonding agent 7.

Input/output terminals 6a, 6b and power semiconductor element 3 or electrically conductive member 4 are bonded together by bonding agent 8a, 8b. Bonding agent 8a, 8b is not as important in thermal conductivity as bonding agent 7, but may be the same in composition as bonding agent 7. Further, direct bonding such as ultrasonic bonding or welding with no explicit bonding agent 8a, 8b may be applied to portions bonded by bonding agent 8a, 8b.

In the above description, direct lead bonding (DLB) has been applied to main wire bonding of module unit 2, but bonding with a commonly used aluminum (Al) or copper (Cu) wire or other bonding may be applied. Further, module unit 2 is not limited to a unit of a transfer mold type, and only needs to be capable of applying heat and pressure to resin insulating member 12.

Next, components constituting cooling unit 13 will be described.

Cooling unit 13 includes heat sink 10 and water jacket 14. The upper surface of heat sink 10 coincides with the upper surface of cooling unit 13. Heat sink 10 and fins 15 are typically made of copper or aluminum excellent in thermal conductivity, or an alloy mainly composed of copper or aluminum. Further, heat sink 10 and fins 15 may be made of a carbon-based material such as carbon nanotubes or graphite that has ultra-high thermal conductivity and is lightweight, or may be made of another material excellent in thermal conductivity. Furthermore, plating may be applied to the surfaces of heat sink 10 and fins 15 to increase corrosion resistance or to make bonding easier. Heat sink 10 and fins 15 may be formed by machining, or alternatively, by casting or molding with a die.

Water jacket 14 is combined with heat sink 10 to form cooling unit 13. Combining water jacket 14 with heat sink 10 forms a channel including fins 15 therein. Water jacket 14 is typically formed by die casting of aluminum that is light in weight and easy in casting, or may be made of other materials.

The structure where heat sink 10 that is commonly used in, for example, on-vehicle power semiconductor devices serves as a part of cooling unit 13 has been described above, but the cooling method is not limited to water cooling. Further, heat sink 10 and fins 15 may have not only a structure where heat sink 10 and fins 15 are integrally formed, but also a structure and material suitable for their uses as cooling unit 13.

Next, resin insulating member 12 and flow blocking member 11 serving as the core of the present invention will be described.

Resin insulating member 12 couples lower surface of module unit 2 and the upper surface of cooling unit 13. Resin insulating member 12 is set larger in outline dimensions than electrically conductive member 4 of module unit 2. This brings the upper surface of resin insulating member 12 into contact with the lower surface of electrically conductive member 4 and the lower surface of scaling member 5. Resin insulating member 12 is not only excellent in thermal conductivity and electrical insulation, but also serves as an adhesive (bonding agent) between module unit 2 and cooling unit 13 and is excellent in mechanical reliability against thermal load and impact. As the material of resin insulating member 12 that satisfies such a requirement, a thermally conductive sheet in which an inorganic filler is dispersed in a cured object of a thermosetting resin is widely used. Examples of the inorganic filler include boron nitride, silicon nitride, alumina, and the like. Examples of the thermosetting resin include an epoxy resin, a polyimide resin, a polyamide resin, and the like. Boron nitride as the inorganic filler is excellent in chemical stability in addition to thermal conductivity and electrical insulation and is nontoxic and relatively low in cot, and thus is often applied to uses particularly required high thermal conductivity and high insulation.

Further, a resin insulating member that is better than a conventional thermally conductive sheet is also available, the resin insulating member being formed by making a base that is isotropically oriented by application of pressure to and sintering of a high thermal conductive inorganic material that is a high thermal conductive material such as boron nitride made particulate in advance and has a large contact area between high thermal conductive inorganic materials and then impregnating gaps in the high thermal conductive inorganic material with a thermosetting resin. Furthermore, the height (thickness) of resin insulating member 12 falls within a range of about 0.2 mm to 0.4 mm, for example.

Flow prevention member 11 is disposed around resin insulating member 12 to surround resin insulating member 12. Flow prevention member 11 is disposed inside the periphery of module unit 2 (sealing member 5). The upper surface of flow blocking member 11 is in contact with the lower surface of scaling member 5. Flow prevention member 11 is more easily compressively deformable than resin insulating member 12. Flow prevention member 11 serves as a wall that resists a force causing the resin in resin insulating member 12 to which beat and pressure are applied at the time of bonding module unit 2 and cooling unit 13 together to leak out (flow out) from the end (periphery) of resin insulating member 12 toward the periphery of module unit 2. That is, flow blocking member 11 serves as a sealant for resin insulating member 12.

The thermosetting resin may become extremely low in viscosity upon application of heat. When module unit 2 and cooling unit 13 are bonded together by resin insulating member 12, the maximum pressure at which the resin is forced to leak out (flow out) from the end of resin insulating member 12 is hydrostatic pressure, and thus is almost equivalent to the pressurizing condition for pressing the upper surface of module unit 2. The actual pressurization value when module unit 2 and cooling unit 13 are bonded together varies in a manner that depends on the material of resin insulating member 12, but may reach, for example, 10 MPa, and the leakage (flow out) pressure on resin may become an extremely large value on the order of MPa. In order to seal the resin against the pressure of this value, it is a matter of course that there is no gap on the upper and lower sides of flow blocking member 11 (an interface with module unit 2 or heat sink 10), but in order to prevent the resin from leaking out from the upper and lower positions of flow blocking member 11, it is necessary to bring about a state where sufficient pressure is applied to flow blocking member 11 from module unit 2 and heat sink 10 between which flow blocking member 11 is disposed.

Figure 3:
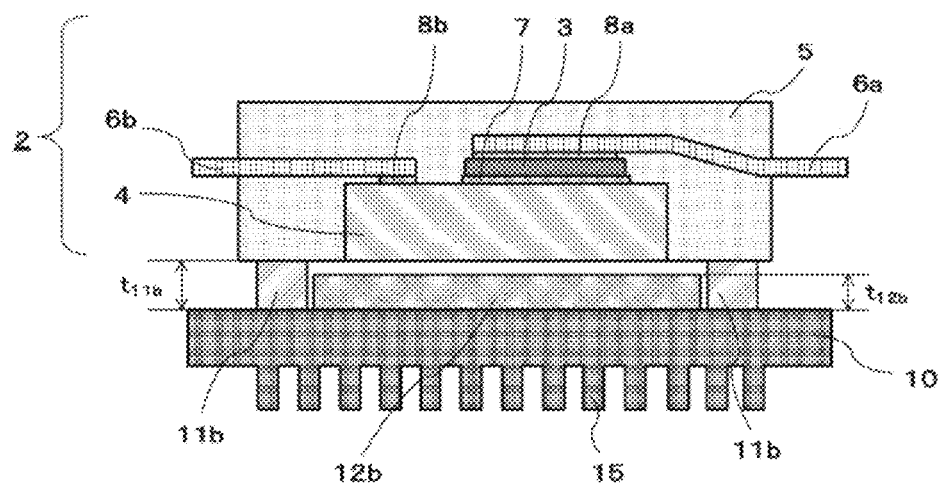
FIG. 3 is a cross-sectional structure view schematically illustrating the power semiconductor device according to the first embodiment of the present invention in a state where pressure has yet to be applied.
Figure 4:
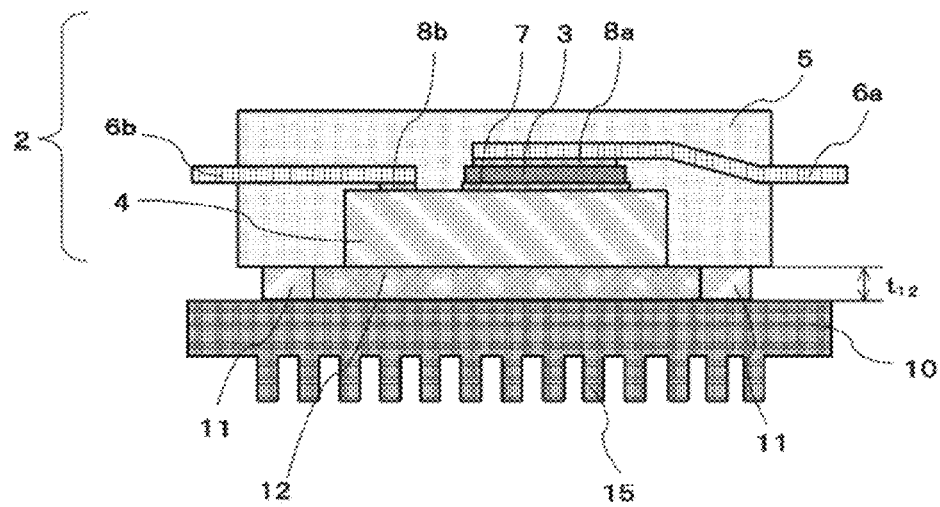
FIG. 4 is a cross-sectional structure view schematically illustrating the power semiconductor device according to the first embodiment of the present invention in a state where pressure has been applied.

FIG. 3 is a cross-sectional structure view schematically illustrating the power semiconductor device according to the first embodiment of the present invention in a state where pressure has yet to be applied. FIG. 4 is a cross-sectional structure view schematically illustrating the power semiconductor device according to the first embodiment of the present invention in a state where pressure has been applied. FIG. 3 illustrates a state where module unit 2 and heat sink 10 have yet to be bonded together. FIG. 4 illustrates a state where module unit 2 and heat sink 10 have been bonded together.

In the drawings, a flow blocking member 11b is a resin flow blocking member in a state where pressure has yet to be applied to module unit 2 and heat sink 10 (module unit 2 and beat sink 10 have yet to be bonded together). Further, a resin insulating member 12b is a resin insulating member in a state where pressure has yet to be applied to module unit 2 and heat sink 10 (module unit 2 and heat sink 10 have yet to be bonded together). As illustrated in FIG. 3, in the state where pressure has yet to be applied, flow blocking member 11b is disposed with a gap from the periphery (edge) of resin insulating member 12b. At this time, flow blocking member 11b is set higher (thicker) than resin insulating member 12. As illustrated in FIG. 4, the application of pressure causes flow blocking member 11b to compress to keep resin insulating member 12b from flowing out toward the periphery of module unit 2 and prevent the flow of resin (leakage of resin). At this time, flow blocking member 11 is compressed upon application of pressure so as to become equal in height to resin insulating member 12. This makes it possible to prevent the flow of resin from resin insulating member 12.

In order to apply sufficient pressure to flow blocking member 11 while applying sufficient pressure to resin insulating member 12 in a heat and pressure application step at the time of bonding module unit 2 and heat sink 10 together, it is important that flow blocking member 11 be made of a material that is larger (greater) in height than resin insulating member 12 in a state where pressure has yet to be applied (bonding has yet to be made) and is easily deformed in response to compression stress applied when module unit 2 and heat sink 10 are bonded together and that a large reduction in the pressure applied to resin insulating member 12 be avoided.

That is, with the height of flow blocking member 11*b* in a state where bonding has yet to be made denoted by $t_{11b}$, the height of resin insulating member 12*b* in a state where bonding has yet to be made denoted by $t_{12b}$, the height of resin insulating member 12 in a state where bonding has been made is denoted by $t_{12}$, when $t_{11b} > t_{12b} > t_{12}$ holds, and the resistance against compression of flow blocking member 11 is denoted by $E_{seal}$, and the resistance against compression of resin insulating member 12 is denoted by $E_{seat}$, a relationship of $E_{seal} < E_{seat}$ needs to hold. In other words, flow blocking member 11*b* in a state where bonding has yet to be made is set greater in height than resin insulating member 12*b* in a state where bonding has yet to be made, and flow blocking member 11 is set smaller in resistance against compression than resin insulating member 12.

Further, flow blocking member 11 needs to have heat resistance against a heating temperature when module unit 2 and heat sink 10 are bonded together. Usually, the bonding temperature is about 180 to 250° C., and it is therefore required that flow blocking member 11 need to have heat resistance against at least 200° C., preferably 250° C. or higher.

Examples of the material of flow blocking member 11 include a rubber material such as a fluorine-based or silicone-based rubber material, a low compression resistance material typified by a low hardness metal such as aluminum, indium, or tin, and an aluminum alloy, indium alloy, or tin alloy mainly composed of aluminum, indium, or tin. Further, the height (thickness) of flow blocking member 11 may be suitably selected in a manner that depends on the material of flow blocking member 11 and may be set to, for example, about 1.05 times to 2 times the height of resin insulating member 12. Furthermore, the width of flow blocking member 11 may be suitably selected in a range of about ½ to 2 in terms of aspect ratio with respect to the thickness of flow blocking member 11.

Note that the cross-sectional shape of flow blocking member 11 in a state where module unit 2 and heat sink 10 have yet to be bonded together may be various shapes such as a circle, an ellipse, a triangle, and a hexagon in addition to the quadrangle illustrated in FIG. 3.

Figure 5:
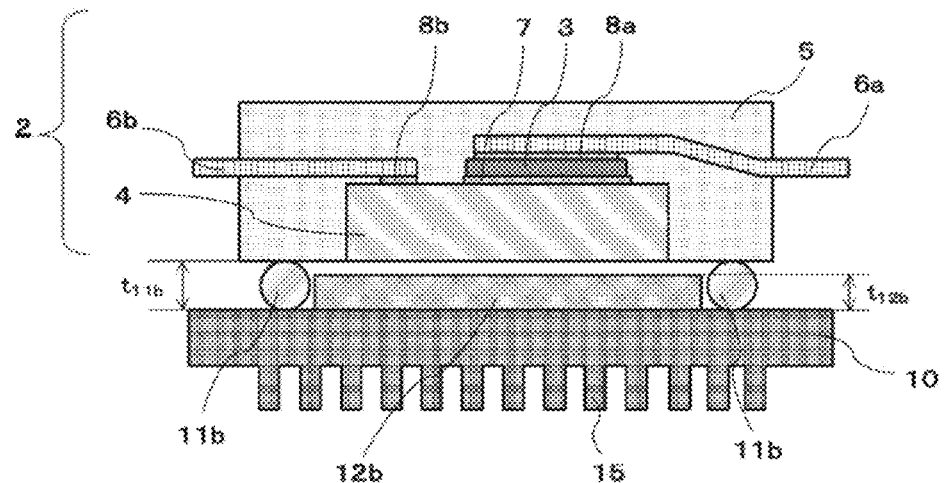
FIG. 5 is a cross-sectional structure view schematically illustrating the power semiconductor device according to the first embodiment of the present invention including a different type of flow blocking member in a state where pressure has yet to be applied.
Figure 6:
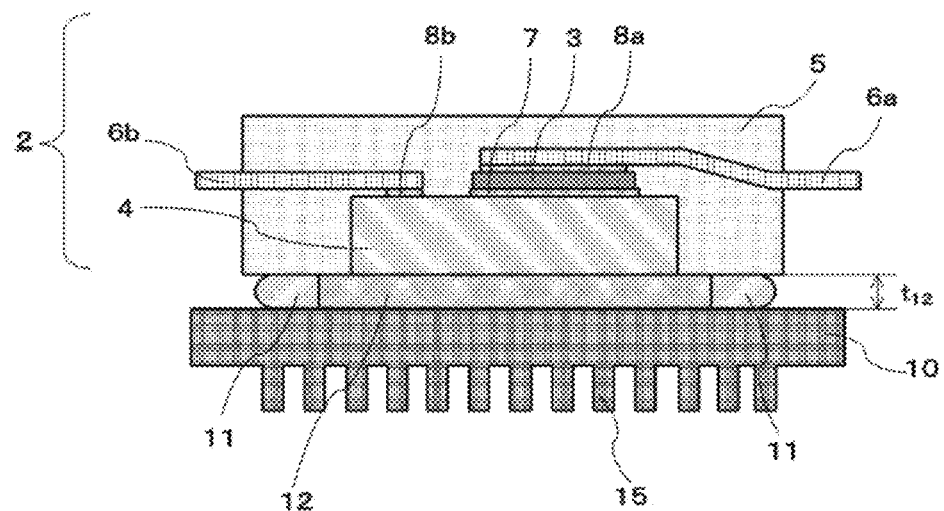
FIG. 6 is a cross-sectional structure view schematically illustrating the power semiconductor device according to the first embodiment of the present invention including the different type of flow blocking member in a state where pressure has been applied.

FIG. 5 is a cross-sectional structure view schematically illustrating the power semiconductor device according to the first embodiment of the present invention including a different type of flow blocking member in a state where pressure has yet to be applied. FIG. 6 is a cross-sectional structure view schematically illustrating the power semiconductor device according to the first embodiment of the present invention including the different type of flow blocking member in a state where pressure has been applied. FIG. 5 illustrates a state where module unit 2 and heat sink 10 have yet to be bonded together, and FIG. 6 illustrates a state where module unit 2 and heat sink 10 have been bonded together. In FIG. 5, flow blocking member 11 is circular in cross section. Flow prevention member 11 is desirably quadrangular or circular in shape from the viewpoint of case of shaping. As illustrated in FIG. 5, even when flow blocking member 11*b* is circular in shape, flow blocking member 11*b* is disposed with a gap from resin insulating member 12 in a state where pressure has yet to be applied. At this time, flow blocking member 11*b* is greater in height than resin insulating member 12. As illustrated in FIG. 6, the application of pressure causes flow blocking member 11*b* to compress to keep resin insulating member 12 from flowing out toward the periphery of module unit 2 and prevent the flow of resin. At this time, flow blocking member 11 is compressed upon application of pressure so as to become equal in height to resin insulating member 12.

Next, the planar shape (in plan view) of flow blocking member 11 will be described.

Figure 7:
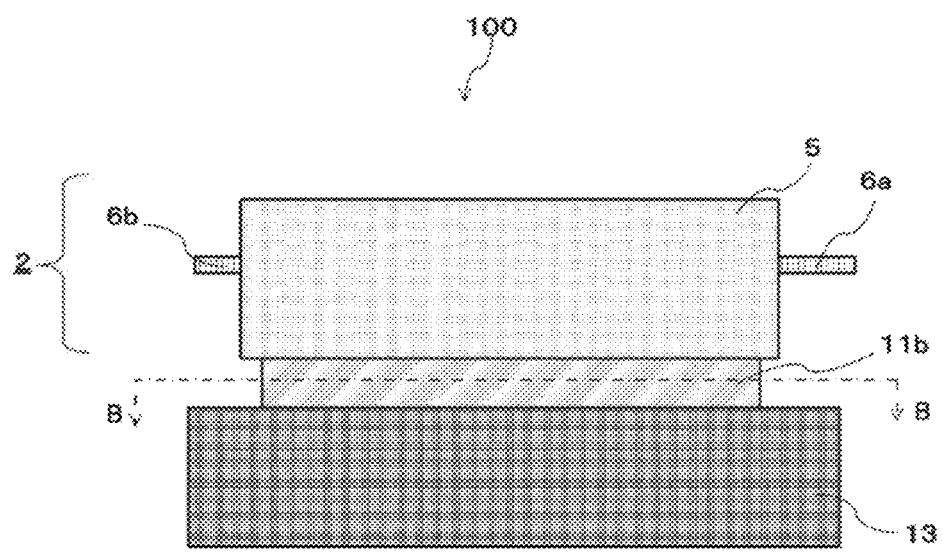
FIG. 7 is an external structure view schematically illustrating a side of the power semiconductor device according to the first embodiment of the present invention.
Figure 8:
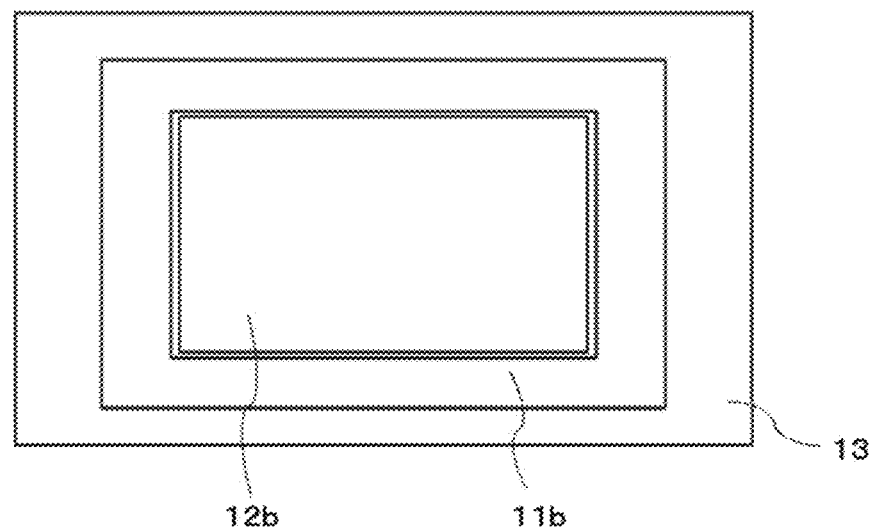
FIG. 8 is a plan structure view schematically illustrating the power semiconductor device according to the first embodiment of the present invention.

FIG. 7 is an external structure view schematically illustrating a side of the power semiconductor device according to the frit embodiment of the present invention. FIG. 8 is a plan structure view schematically illustrating the power semiconductor device according to the first embodiment of the present invention. FIG. 8 is a schematic plan structure view taken along a long dashed short dashed line BB in FIG. 7.

As illustrated in the drawings, in a state where module unit 2 and heat sink 10 have yet to be bonded together, flow blocking member 11*b* is disposed all around (the entire periphery) resin insulating member 12*b* (with a gap). When flow blocking member 11*b* is disposed as described above, it is possible to prevent resin from flowing out from resin insulating member 12 over the entire periphery upon application of heat and pressure to bond module unit 2 and heat sink 10 together. For the purpose of sealing to prevent resin from flowing out, it is desirable that flow blocking member 11*b* disposed around resin insulating member 12*b* have no joint that tends to be a mechanical weak point.

The frame shape having no joint of flow blocking member 11*b* can be made by stamping from a plate-like material. In order to make flow blocking member 11*b*, it is desirable that flow blocking member 11*b* be formed with a die or cast from a mold from the viewpoint of yields.

Next, a method for positioning resin flow blocking member 11 will be described.

Figure 9:
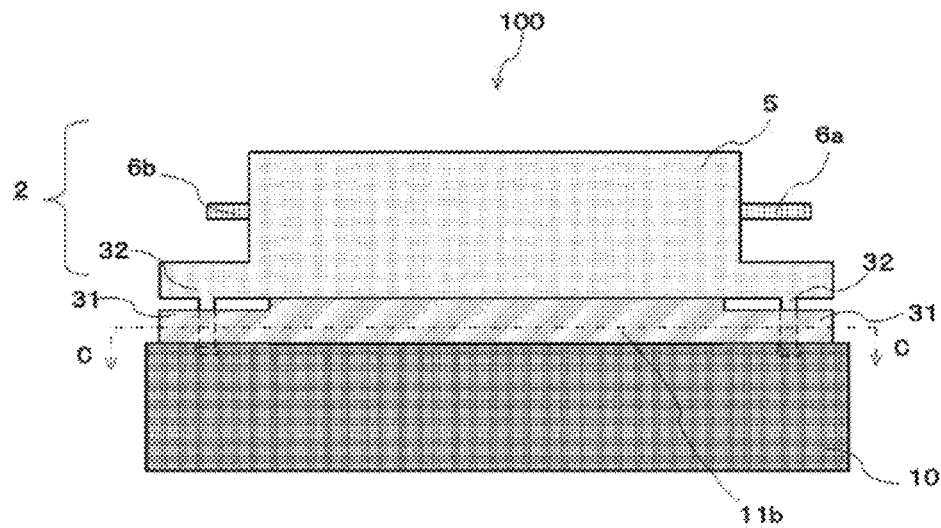
FIG. 9 is an external structure view schematically illustrating a side of a different type of power semiconductor device according to the first embodiment of the present invention.
Figure 10:
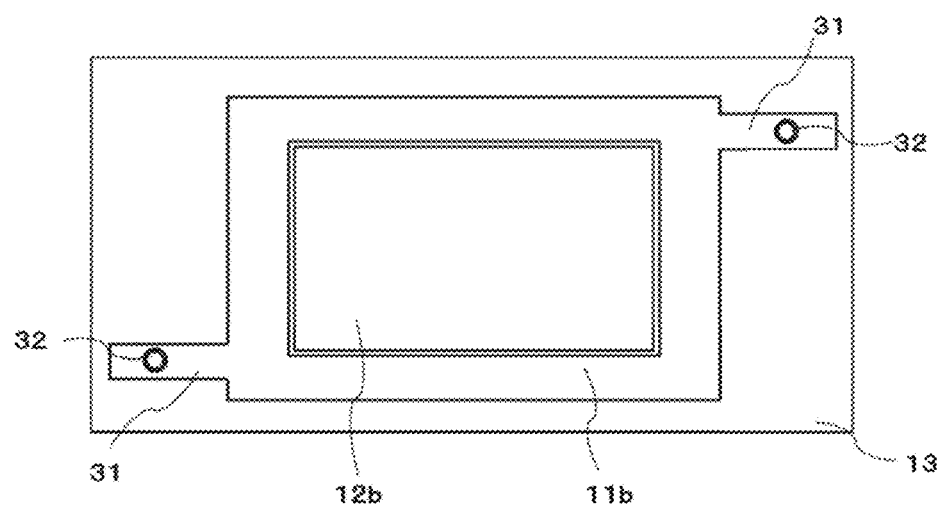
FIG. 10 is a plan structure view schematically illustrating the different type of power semiconductor device according to the first embodiment of the present invention.

FIG. 9 is an external structure view schematically illustrating a side of a different type of power semiconductor device according to the first embodiment of the present invention. FIG. 10 is a plan structure view schematically illustrating the different type of power semiconductor device according to the first embodiment of the present invention. FIG. 10 is a schematic cross-sectional structure view taken along a long dashed short dashed line CC in FIG. 9.

FIGS. 9 and 10 illustrate an example of the method for positioning module unit 2 and flow blocking member 11. In the drawings, a positioning pin 32 of module unit 2 is integrally formed by transfer molding so as to project from the periphery of module unit 2 when module unit 2 is sealed in sealing member 5. A positioning hole is formed at a position corresponding to positioning pin 32 of module unit 2 in the upper surface of heat sink 10, and positioning pin 32 of module unit 2 is inserted into the positioning hole to position module unit 2 on heat sink 10. Flow prevention member 11 also has a through hole formed at a position corresponding to positioning pin 32 of module unit 2 in a positioning projection 31 of flow blocking member 11 projecting toward the periphery of heat sink 10 so as to be positioned relative to module unit 2.

In the above description, positioning pin 32 of module unit 2 is disposed on module unit 2 side, but a positioning pin or positioning frame for positioning relative to module unit 2 may be disposed on heat sink 10 side. In particular, when heat sink 10 is formed with a die or cast from a mold, the positioning pin or the positioning frame can be easily formed.

Further, as another positioning method, flow blocking member 11 and resin insulating member 12 may be integrally formed in advance by press-fitting resin insulating member 12 into flow blocking member 11 or temporarily bonding resin insulating member 12 and flow blocking member 11 together. Resin insulating member 12 is suitable, for example, in a case of a material having a certain degree of mechanical strength, such as a base of boron nitride impregnated with resin.

As described above, flow blocking member 11 that is more easily compressively deformable than resin insulating member 12 is disposed around resin insulating member 12, so that even when pressure is applied to module unit 2 and cooling unit 13 to bond module unit 2 and cooling unit 13 together, generation of voids is suppressed in the periphery of resin insulating member 12. This allows an increase in insulation and heat dissipation of the bonding between module unit 2 and cooling unit 13 and an increase in reliability of power semiconductor device 100.

Next, a manufacturing method for power semiconductor device 100 according to the first embodiment structured as described above will be described.

First, module unit 2 of power semiconductor device 100 is produced. The lower electrode of power semiconductor element 3 is bonded to the upper surface side of electrically conductive member 4 via bonding agent 7. Input/output terminal 6a is bonded to the upper electrode of power semiconductor element 3 via bonding agent 8a. Input/output terminal 66 is bonded to a predetermined position on the upper surface of electrically conductive member 4 via bonding agent 8b. After power semiconductor element 3 and input/output terminals 6a, 6b are bonded to the upper surface of electrically conductive member 4, power semiconductor element 3 and input/output terminals 6a, 6b are integrally sealed in sealing member 5 with the lower surface of electrically conductive member 4 exposed, thereby forming module unit 2 (module unit forming step).

Next, the lower surface of heat sink 10 and water jacket 14 are bonded together to surround heat sink 10 and fins 15 disposed on the lower surface of heat sink 10, thereby forming cooling unit 13 (cooling unit preparing step).

Next, resin insulating member 12 (12b) is disposed on the upper surface of cooling unit 13 (heat sink 10)(resin insulating member disposing step). After resin insulating member 12 is disposed, flow blocking member 11 (11b) is disposed around resin insulating member 12 so as to be separated from the edge of resin insulating member 12 (resin insulating member and flow blocking member disposing step).

Module unit 2 is disposed on the upper surface of cooling unit 13 so as to bring the upper surface of resin insulating member 12 thus disposed into contact with the lower surface of electrically conductive member 4 of module unit 2 (module unit disposing step).

Ater module unit 2 is disposed on the upper surface of cooling unit 13, heat and pressure are applied to module unit 2 and cooling unit 13 to bond module unit 2 and cooling unit 13 together (module unit bonding step). At this time, since flow blocking member 11 is set smaller in resistance against compressive deformation (more easily compressively deformable) than resin insulating member 12, application of pressure to module unit 2 side causes flow blocking member 11b to compress, thereby preventing resin insulating member 12b from leaking out from the periphery of module unit 2.

Power semiconductor device 100 illustrated in FIGS. 1 and 2 can be produced by the main manufacturing steps described above.

As a result of intensive studies on the planar shape of flow blocking member 11, it has been found that electrical insulation between module unit 2 and heat sink 10 (cooling unit 13) can be secured even when a joint is provided in a part of flow blocking member 11 disposed in the peripheral region of resin insulating member 12.

Figure 11:
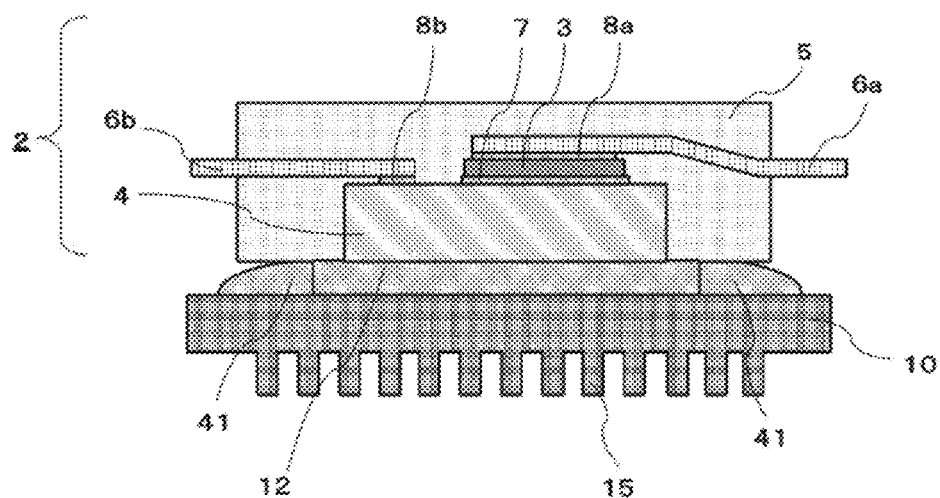
FIG. 11 is a cross-sectional structure view schematically illustrating a power semiconductor device according to a comparative example.
Figure 12:
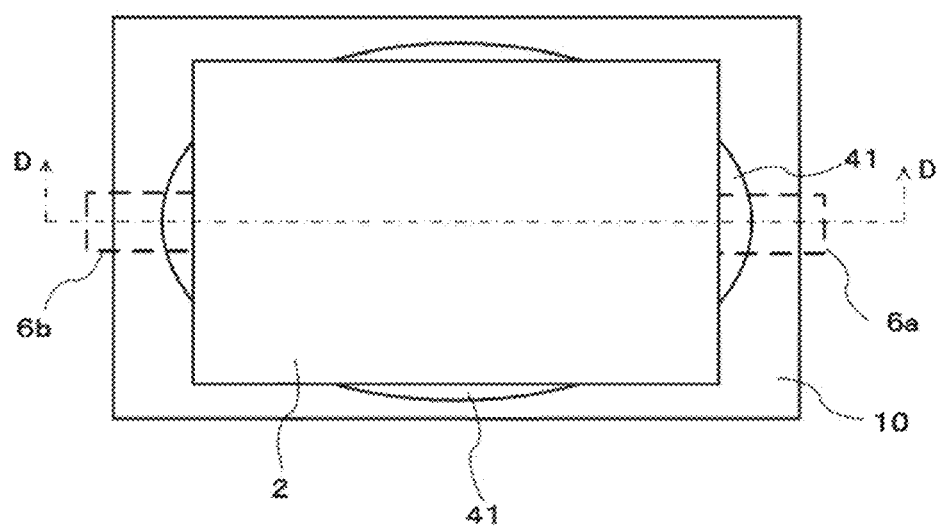
FIG. 12 is a plan structure view schematically illustrating the power semiconductor device according to the comparative example.

FIG. 11 is a cross-sectional structure view schematically illustrating a power semiconductor device according to a comparative example. FIG. 12 is a plan structure view schematically illustrating the power semiconductor device according to the comparative example. FIG. 11 is a schematic cross-sectional structure view taken along a long dashed short dashed line DD in FIG. 12. In FIG. 12, input/output terminals 6a, 6b are represented by dotted lines for easy understanding of a state of resin 41 flowing out from resin insulating member 12. As illustrated in FIGS. 11 and 12, when flow blocking member 11 is not provided, resin 41 flows out from resin insulating member 12, and the amount of resin 41 flowing out from resin insulating member 12 is larger at the center of each of the four sides of resin insulating member 12 and is nearly zero at the corners of each side. That is, in a state where module unit 2 and cooling unit 13 have yet to be bonded together, resin at the corners of each side of resin insulating member 12 is attracted to the center of the side by bonding (application of pressure to) module unit 2 and cooling unit 13, resulting in a shortage of resin at the corners of each side. This makes dielectric breakdown of the power semiconductor device prone to occur at the corners of each side of resin insulating member 12.

That is, it has been found that disposing the joint of flow blocking member 11 around a corner of a side of resin insulating member 12 prevents, even when resin flows out from the joint of flow blocking member 11, the shortage of resin at the corner of the side of the resin insulating member, thereby obtaining good dielectric strength.

A description will be given below of a modification of the planar shape (in plan view) of flow blocking member 11 based on the above findings.

FIGS. 13 to 17 are plan structure views schematically illustrating flow blocking members according to the first embodiment of the present invention.

Figure 13:
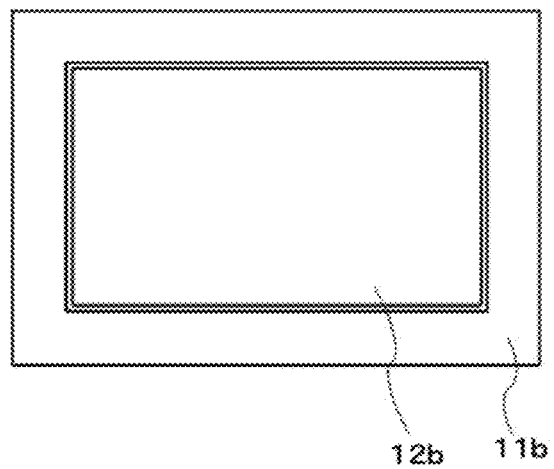
FIG. 13 is a plan structure view schematically illustrating a flow blocking member according to the first embodiment of the present invention.
Figure 14:
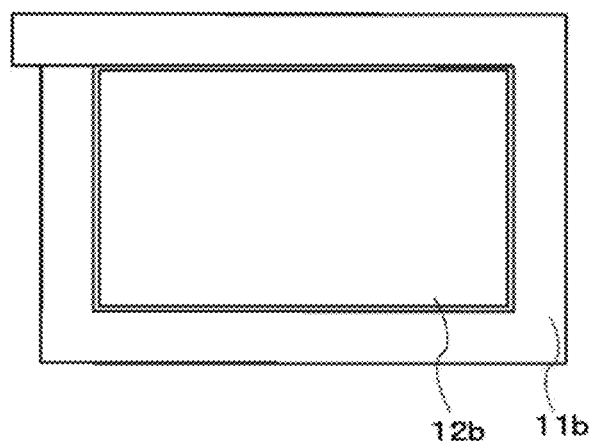
FIG. 14 is a plan structure view schematically illustrating another type of flow blocking member according to the first embodiment of the present invention.
Figure 15:
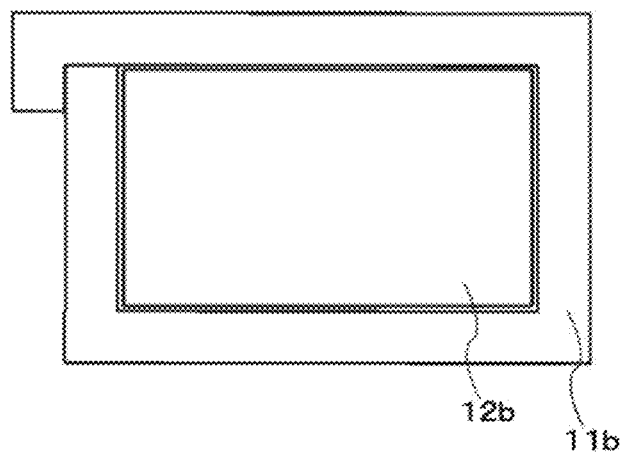
FIG. 15 is a plan structure view schematically illustrating another type of flow blocking member according to the first embodiment of the present invention.
Figure 16:
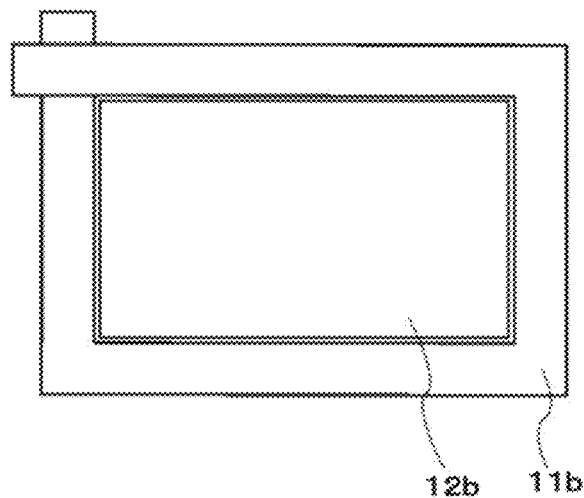
FIG. 16 is a plan structure view schematically illustrating another type of flow blocking member according to the first embodiment of the present invention.
Figure 17:
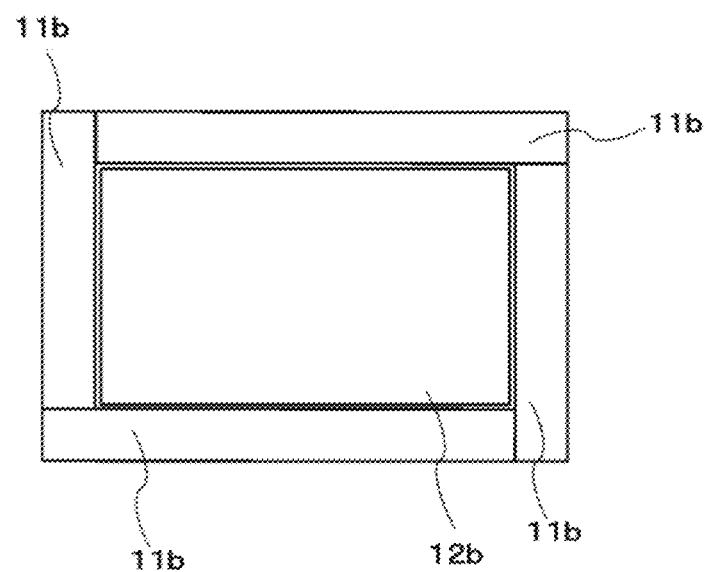
FIG. 17 is a plan structure view schematically illustrating another type of flow blocking member according to the first embodiment of the present invention.

In the drawings, resin insulating member 12b is also illustrated together with flow blocking member 11b. FIG. 13 illustrates flow blocking member 11b having no joint similar to the structure illustrated in FIG. 8. In FIG. 13, flow blocking member 11b having no joint is disposed wound resin insulating member 12b. FIGS. 14 to 16 illustrate structure examples where flow blocking member 11b has one joint provided in a corner region of a side of resin insulating member 12b. FIG. 14 illustrates a structure where the joint of flow blocking member 11b is in contact (connected) at the corner of the side of resin insulating member 12b. FIG. 15 illustrates a structure where flow blocking member 11 overlaps at the joint of flow blocking member 11b. FIG. 16 illustrates a structure where flow blocking member 11b intersects at the corner of the side of resin insulating member 12b, and the joint extends approximately along a plane. Further, FIG. 17 illustrates an example where a plurality of flow blocking members 11b me used, and a plurality of joints are provided, specifically, the joints of flow blocking members 11b are provided at four corners of the sides.

The joint of each of flow blocking members 11b may be similar to the joint illustrated in FIG. 15 or FIG. 16. When a single joint of flow blocking member 1i b as illustrated in FIGS. 14 to 16 is provided, flow blocking member 11b can be formed of one wire rod, and when a plurality of joints are provided at the corners of each side of flow blocking member 11 as illustrated in FIG. 17, flow blocking member 11*b* can be formed of a plurality of wire rods. As described above, flow blocking member 11*b* is made of a wire rod, and the intersection portion or connection portion of flow blocking member 11*b* disposed around resin insulating member 12*b* is located at a corner of resin insulating member 12*b*.

Next, a modification of the method for positioning flow blocking member 11 including flow blocking member 11 described above will be described.

As described above, when a wire rod is used as flow blocking member 11, forming a positioning groove 33, 34 for positioning flow blocking member 11 on at least either module unit 2 or heat sink 10 and fitting the wire rod into positioning groove 33, 34 for positioning flow blocking member 11 is easier than forming positioning projection 31 of flow blocking member 11 as illustrated in FIGS. 9 and 10.

Figure 18:
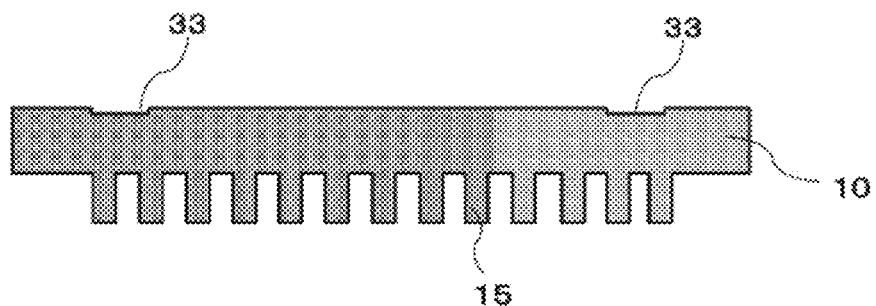
FIG. 18 is a plan structure view schematically illustrating a manufacturing step of the power semiconductor device according to the first embodiment of the present invention.
Figure 19:
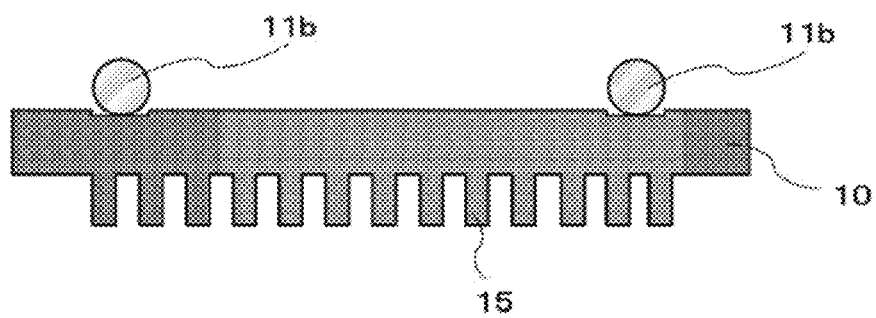
FIG. 19 is a plan structure view schematically illustrating the manufacturing step of the power semiconductor device according to the first embodiment of the present invention.
Figure 20:
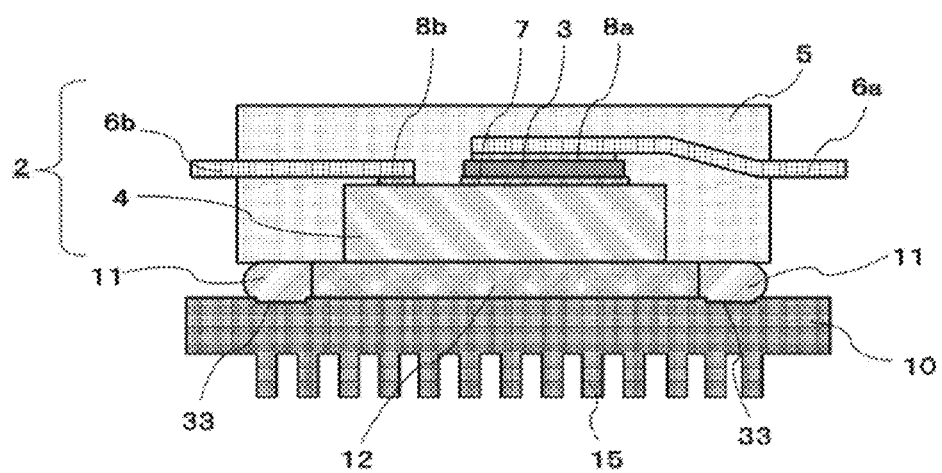
FIG. 20 is a plan structure view schematically illustrating the manufacturing step of the power semiconductor device according to the first embodiment of the present invention.
Figure 21:
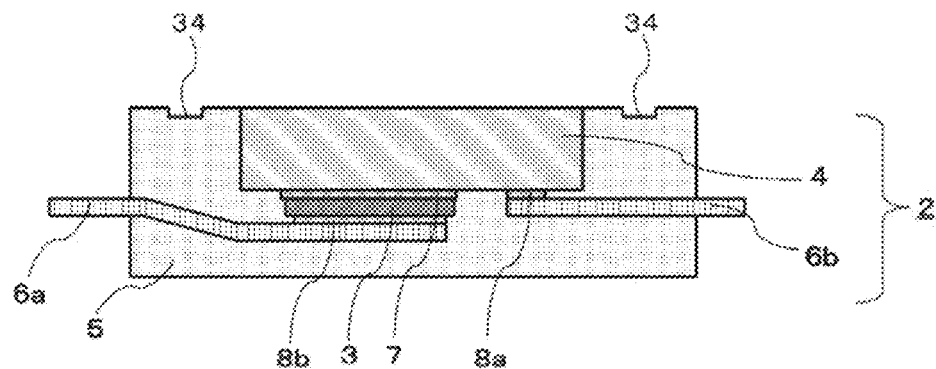
FIG. 21 is a plan structure view schematically illustrating a manufacturing step of a different type of power semiconductor device according to the first embodiment of the present invention.
Figure 22:
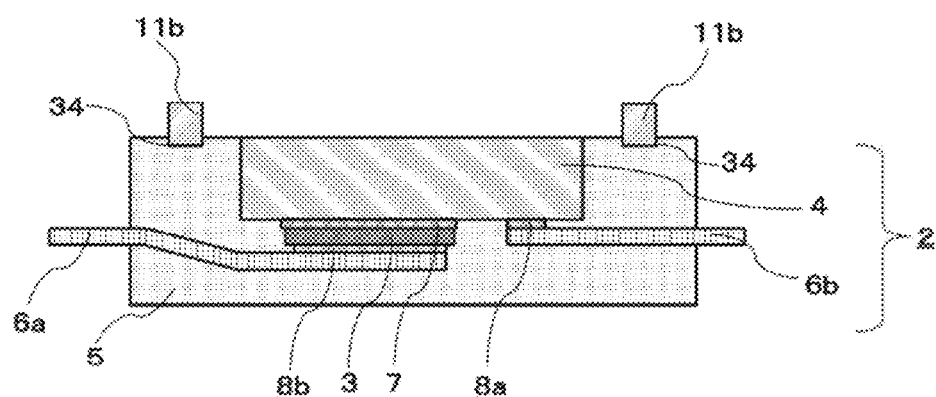
FIG. 22 is a plan structure view schematically illustrating the manufacturing step of the different type of power semiconductor device according to the first embodiment of the present invention.
Figure 23:
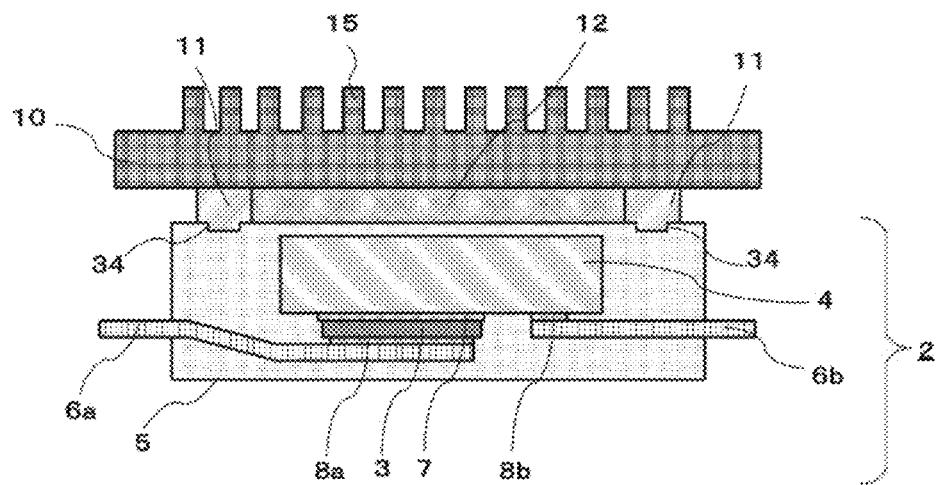
FIG. 23 is a plan structure view schematically illustrating the manufacturing step of the different type of power semiconductor device according to the first embodiment of the present invention.

FIGS. 18 to 23 are plan structure views schematically illustrating a manufacturing step of the power semiconductor device according to the first embodiment of the present invention. FIGS. 18 to 20 illustrate a case where positioning groove 33 for positioning flow blocking member 11 is formed on the upper surface of heat sink 10. FIGS. 21 to 23 illustrate a case where positioning groove 34 for positioning flow blocking member 11 is formed on the lower surface of module unit 2. Flow prevention member 11*b* in a state where module unit 2 and cooling unit 13 have yet to be bonded together is circular in cross section in the case illustrated in FIGS. 18 to 20. In the case illustrated in FIGS. 21 to 23, flow blocking member 11*b* is quadrangular in cross section. In any case, regardless of where positioning groove 33, 34 for positioning flow blocking member 11 is formed, flow blocking member 11 having a circular, quadrangular, or another shape in cross section is applicable.

In a case where positioning groove 33 is formed on the upper surface of heat sink 10, as illustrated in FIG. 18, positioning groove 33 is provided on the upper surface of heat sink 10 by machining such as cutting, preferably casting or molding with a die. Next, as illustrated in FIG. 19, flow blocking member 11*b* in a state where bonding has yet to be made is disposed to fit into positioning groove 33. Subsequently, resin insulating member 12*b* in a state where bonding has yet to be made is disposed in a region surrounded by flow blocking member 11*b* using flow blocking member 11*b*, and module unit 2 is disposed on the upper surface of heat sink 10, and heat and pressure is applied to module unit 2 and heat sink 10 so as to make the form illustrated in FIG. 20. As described above, disposing resin insulating member 12*b* after disposing flow blocking member 11*b* makes the positioning of resin insulating member 12*b* easier, but flow blocking member 11*b* and resin insulating member 12*b* may be disposed in reverse order.

In a case where positioning groove 34 for positioning flow blocking member 11 is formed on the lower surface of module unit 2, as illustrated in FIG. 21, positioning groove 34 for positioning flow blocking member 11 is formed, with a die, on the lower surface of module unit 2 at the same time as transfer molding of module unit 2. Next, as illustrated in FIG. 22, flow blocking member 11*b* in a state where bonding has yet to be made is disposed to fit into positioning groove 34 for positioning flow blocking member 11. Subsequently, resin insulating member 12*b* in a state where bonding has yet to be made is disposed in a region surrounded by flow blocking member 11*b* using flow blocking member 11*b*, and heat sink 10 is disposed on the lower surface of module unit 2, and heat and pressure is applied to heat sink 10 and module unit 2 so as to make the form illustrated in FIG. 23. As described above, disposing resin insulating member 12*b* after disposing flow blocking member 11*b* makes the positioning of resin insulating member 12*b* easier, but flow blocking member 11*b* and resin insulating member 12*b* may be disposed in reverse order.

Another example of the method for positioning flow blocking member 11 will be described. When flow blocking member 11 and heat sink 10 are made of metal such as aluminum, for example, flow blocking member 11 can be directly bonded (joined) to the upper surface of heat sink 10. Wire bonding using equipment such as a wire bonder, for example, without forming positioning groove 33 as illustrated in FIG. 18 allows flow blocking member 11 using a bonding wire to be disposed on the upper surface of heat sink 10. In this case, as means for direct bonding, spot welding using laser welding or the like is also applicable in addition to solid phase bonding such as ultrasonic bonding.

In power semiconductor device 100 structured as described above, flow blocking member 11 that is more easily compressively deformable than resin insulating member 12 is disposed around resin insulating member 12, so that even when pressure is applied to module unit 2 and cooling unit 13 to bond module unit 2 and cooling unit 13 together, generation of voids is suppressed in the periphery of resin insulating member 12. This allows an increase in insulation and heat dissipation of the bonding between module unit 2 and cooling unit 13 and an increase in reliability of power semiconductor device 100.

Second Embodiment

The second embodiment is different from the first embodiment in that a projection 22, 23 projecting from the lower surface of module unit 2 or the upper surface of cooling unit 13 (the upper surface of heat sink 10) is provided around resin insulating member 12. As described above, since projection 22, 23 projecting from the lower surface of module unit 2 or the upper surface of cooling unit 13 (the upper surface of heat sink 10) is formed around resin insulating member 12, flow blocking member 11 is compressed by pressure applied by projection 22, 23 and a surface facing projection 22, 23, and generation of voids is suppressed in the periphery of resin insulating member 12. This allows an increase in insulation and heat dissipation of the bonding between module unit 2 and cooling unit 13 and an increase in reliability of power semiconductor device 100. Note that other points are the same as those according to the first embodiment, and thus no detailed description of such points will be given.

Figure 24:
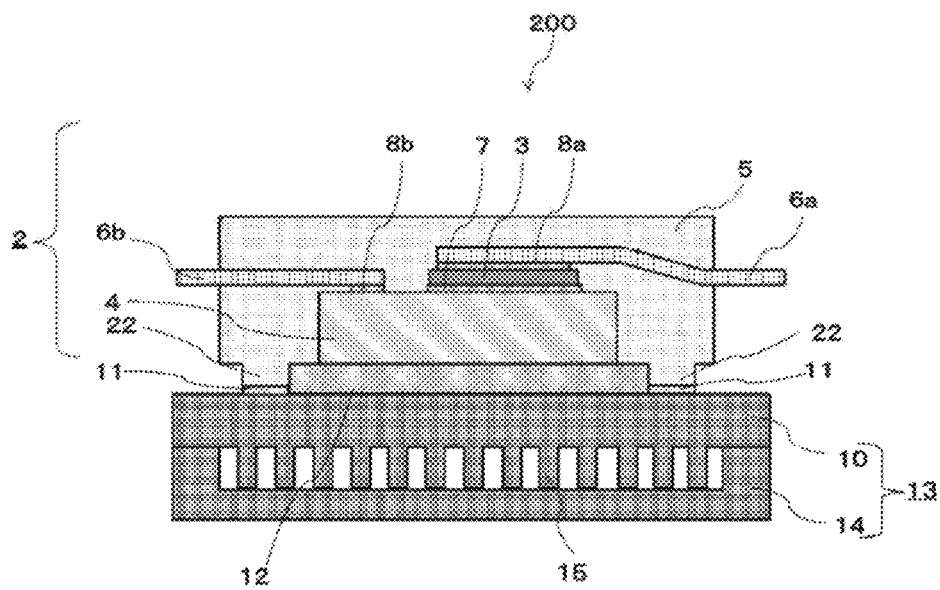
FIG. 24 is a cross-sectional structure view schematically illustrating a power semiconductor device according to a second embodiment of the present invention.

FIG. 24 is a cross-sectional structure view schematically illustrating a power semiconductor device according to the second embodiment of the present invention. In the drawing, a power semiconductor device 200 includes module unit 2, cooling unit 13, resin insulating member 12, and flow blocking member 11. Further, module unit 2 includes power semiconductor element 3, electrically conductive member 4 having a plate shape, input/output terminals 6*a*, 6*b*, bonding agent 7, 8*a*, 8*b*, sealing member 5, and projection 22 serving as a first projection. Further, cooling unit 13 includes heat sink 10, fins 15, and water jacket 14.

In the drawing, in power semiconductor device 200, module unit 2 and cooling unit 13 are coupled together with resin insulating member 12 interposed therebetween. Flow prevention member 11 is disposed around resin insulating member 12 and between projection 22 projecting from the lower surface of module unit 2 and cooling unit 13 (heat sink 10). That is, flow blocking member 11 is disposed on a surface of projection 22 facing heat sink 10. Projection 22 projecting from the lower surface of module unit 2 is disposed around resin insulating member 12 and allows resin insulating member 12 to be positioned. The planar shape of the contact surface between projection 22 and flow blocking member 11 is desirably the same as the planar shape of flow blocking member 11.

As described above, projection 22 and flow blocking member 11 are formed around resin insulating member 12, so that it is possible to prevent resin insulating member 12 from flowing out while suppressing generation of voids in resin insulating member 12 at the time of bonding module unit 2 and cooling unit 13 together by application of heat and pressure.

Next, an example of a manufacturing step according to the second embodiment of the present invention will be described. Projection 22 formed on the lower surface of module unit 2 can be formed at the same time when sealing member (mold resin) 5 is formed by transfer molding or the like in the module unit forming step. Subsequently, in the resin insulating member and flow blocking member disposing step, a material such as silicone rubber that can be applied and is to be flow blocking member 11 is applied to a portion of projection 22 to be the contact surface with flow blocking member 11 and set by heat treatment or the like to form flow blocking member 11. Such a manufacturing step allows a resin flow prevention structure to be made at low cost. Projection 22 allows flow blocking member 11 to prevent resin from flowing out from resin insulating member 12 with a thickness less than the thickness of resin insulating member 12.

Figure 25:
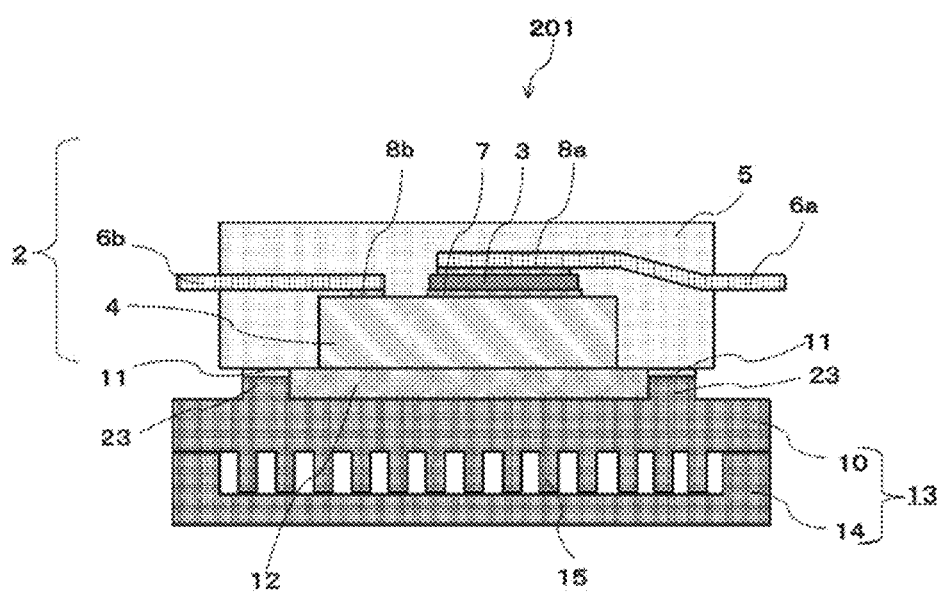
FIG. 25 is a cross-sectional structure view schematically illustrating another type of power semiconductor device according to the second embodiment of the present invention.

FIG. 25 is a cross-sectional structure view schematically illustrating another type of power semiconductor device according to the second embodiment of the present invention. In the drawing, a power semiconductor device 201 includes module unit 2, cooling unit 13, resin insulating member 12, and flow blocking member 11. Further, module unit 2 includes power semiconductor element 3, electrically conductive member 4 having a plate shape, input/output terminals 6a, 6b, bonding agent 7, 8a, 8b, and scaling member 5. Further, cooling unit 13 includes heat sink 10, fins 15, and water jacket 14. Heat sink 10 includes projection 23 serving as a second projection on the upper surface.

In the drawing, in power semiconductor device 201, module unit 2 and cooling unit 13 are coupled together with resin insulating member 12 interposed therebetween. Flow prevention member 11 is disposed around resin insulating member 12 and between projection 23 projecting from the upper surface of heat sink 10 and module unit 2. That is, flow blocking member 11 is disposed on a surface of projection 23 facing module unit 2. Projection 23 projecting from the upper surface of heat sink 10 is disposed around resin insulating member 12 and projection 23 allows resin insulating member 12 to be positioned. The planar shape of the contact surface between projection 23 and flow blocking member 11 is desirably the same as the planar shape of flow blocking member 11.

As described above, projection 23 and flow blocking member 11 are formed around resin insulating member 12, so that it is possible to prevent resin insulating member 12 from flowing out while suppressing generation of voids in resin insulating member 12 at the time of bonding module unit 2 and cooling unit 13 together by application of heat and pressure.

Next, an example of the manufacturing step according to the second embodiment of the present invention will be described. Projection 23 formed on the upper surface of heat sink 10 is inseparable from heat sink 10 and is formed by machining such as cutting, preferably casting or molding with a die at the time of making heat sink 10. Subsequently, in a resin insulating member and flow blocking member disposing step, a material such as silicone rubber that can be applied and is to be flow blocking member 11 is applied to a portion of projection 23 to be the contact surface with flow blocking member 11 and cured by heat treatment or the like to form flow blocking member 11. Such a manufacturing step allows a resin flow prevention structure to be made at low cost. Projection 23 allows flow blocking member 11 to prevent resin from flowing out from resin insulating member 12 with a thickness less than the thickness of resin insulating member 12.

According to the second embodiment, flow blocking member 11 is not necessarily a coating material, and various materials and forms described in the rum embodiment may be used. In this case, even when a standard member (a seal member having a general thickness) in which the thickness of flow blocking member 11 is different from $t_{11b}$ in FIG. 3 is used, for example, adjusting the height of projection 22, 23 allows even the standard member to prevent resin from flowing out from resin insulating member 12. That is, projection 22, 23 serves as an assist member for flow blocking member 11. It is also possible to provide both projection 22 projecting from the lower surface of module unit 2 and projection 23 projecting from the upper surface of heat sink 10. In this case, flow blocking member 11 is disposed between projection 22 and projection 23. Note that, according to the second embodiment, a thickness (height) when at least either projection 22 or projection 23 and flow blocking member 11 are used is set equal to $t_{12}$ illustrated in FIG. 4 and the like as the final shape.

In power semiconductor device 200 structured as described above, flow blocking member 11 that is more easily compressively deformable than resin insulating member 12 is disposed around resin insulating member 12, so that even when pressure is applied to module unit 2 and cooling unit 13 to bond module unit 2 and cooling unit 13 together, generation of voids is suppressed in the periphery of resin insulating member 12. This allows an increase in insulation and heat dissipation of the bonding between module unit 2 and cooling unit 13 and an increase in reliability of power semiconductor device 200.

Further, flow blocking member 11 is formed on projection 22, 23, which eliminates the need for positioning projection 22, 23 and flow blocking member 11.

Further, the use of projection 22, 23 makes it possible to easily position resin insulating member 12 relative to flow blocking member 11.

Third Embodiment

The third embodiment is different from the first embodiment in that a flow prevention reinforcing wall 24, 25, 26 projecting from the lower surface of module unit 2 or the upper surface of cooling unit 13 (the upper surface of heat sink 10) is formed around flow blocking member 11. As described above, flow prevention reinforcing wall 24, 25, 26 projecting from the lower surface of module unit 2 or the upper surface of cooling unit 13 (the upper surface of heat sink 10) is formed around flow blocking member 11, so that even when pressure that forces resin to flow out from resin insulating member 12 is high, providing flow prevention reinforcing wall 24, 25, 26 prevents resin from flowing out and suppresses generation of voids in the periphery of resin insulating member 12. This allows an increase in insulation and heat dissipation of the bonding between module unit 2 and cooling unit 13 and an increase in reliability of a power semiconductor device 300. Note that other points are the same as those according to the first embodiment, and thus no detailed description of such points will be given.

Figure 26:
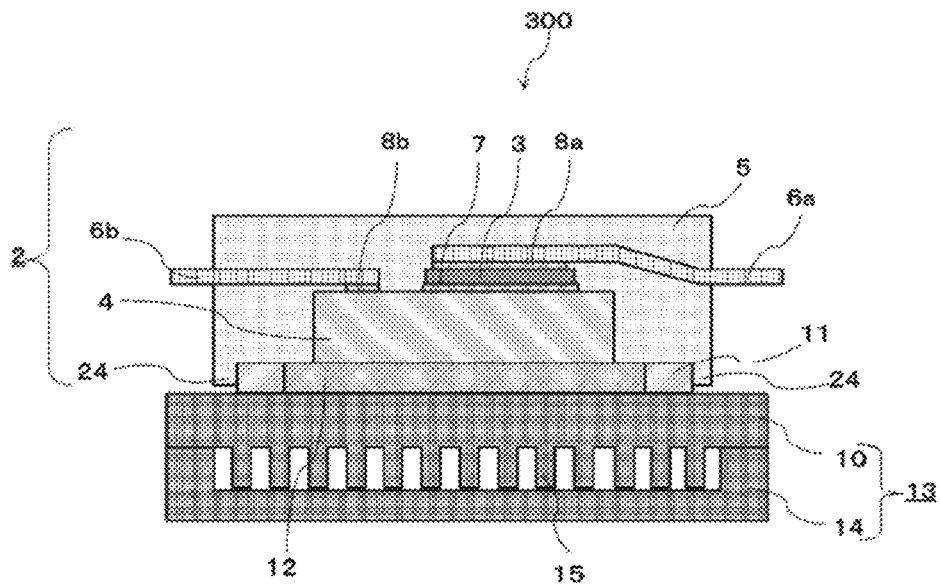
FIG. 26 is a cross-sectional structure view schematically illustrating a power semiconductor device according to a third embodiment of the present invention.

FIG. 26 is a cross-sectional structure view schematically illustrating the power semiconductor device according to the third embodiment of the present invention. In the drawing, power semiconductor device 300 includes module unit 2, cooling unit 13, resin insulating member 12, and flow blocking member 11. Further, module unit 2 includes power semiconductor element 3, electrically conductive member 4 having a plate shape, input/output terminals 6a, 6b, bonding agent 7, 8a, 8b, sealing member 5, and flow prevention reinforcing wall 24. Further, cooling unit 13 includes heat sink 10, fins 15, and water jacket 14.

In the drawing, in power semiconductor device 300, module unit 2 and cooling unit 13 are coupled together with resin insulating member 12 interposed therebetween. Flow prevention member 11 is disposed around resin insulating member 12 and between module unit 2 and cooling unit 13 (heat sink 10). Further, around flow blocking member 11, flow prevention reinforcing wall 24 projecting from the lower surface of module unit 2 toward the upper surface of heat sink 10 is disposed. With module unit 2 and cooling unit 13 bonded together, flow prevention reinforcing wall 24 has a gap from the upper surface of cooling unit 13 (the upper surface of beat sink 10).

As described above, flow prevention reinforcing wall 24 projecting from the lower surface of module unit 2 is formed around flow blocking member 11, so that even when pressure that forces resin to flow out from resin insulating member 12 is high at the time of bonding module unit 2 and cooling unit 13 together by application of beat and pressure, it is possible to prevent resin insulating member 12 from flowing out while suppressing generation of voids in resin insulating member 12.

Flow prevention reinforcing wall 24 is desirably formed at the same time when sealing member (mold resin) 5 is formed by transfer molding or the like in the module unit forming step.

Next, effects of resin flow prevention reinforcing wall 24 will be described.

Figure 27:
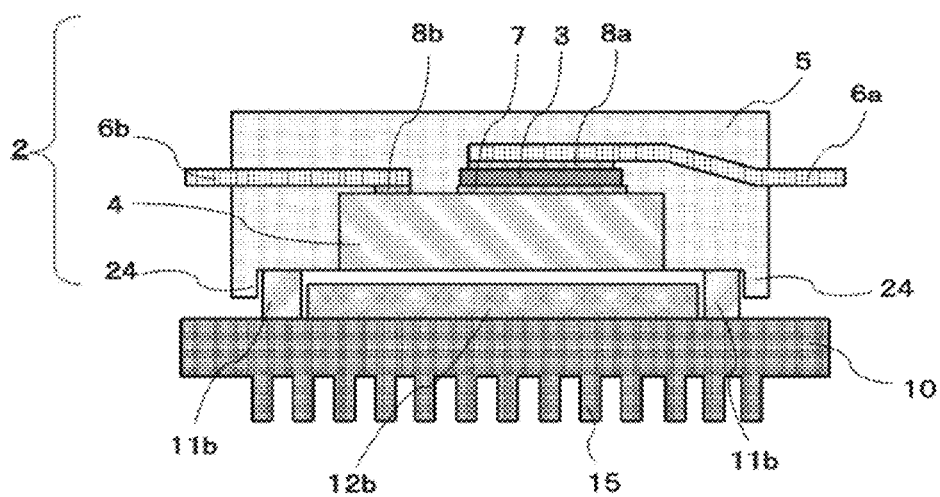
FIG. 27 is a cross-sectional structure view schematically illustrating a manufacturing step of the power semiconductor device according to the third embodiment of the present invention.
Figure 28:
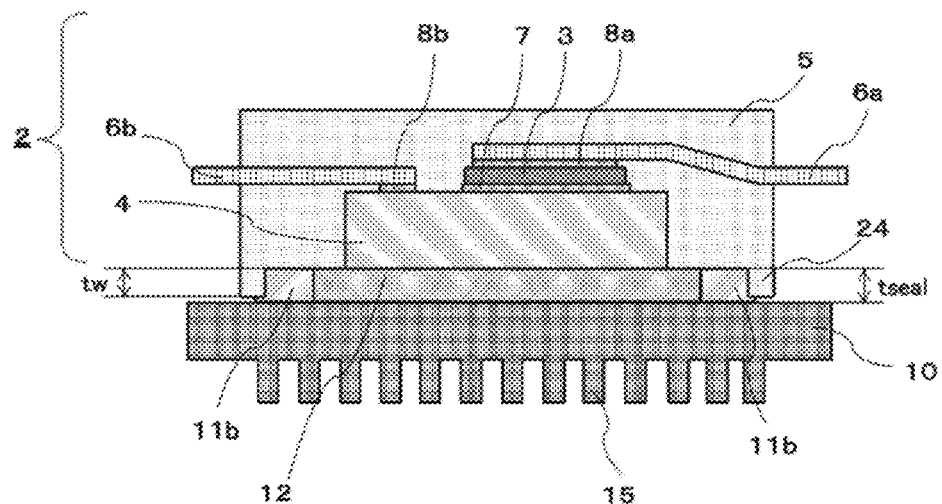
FIG. 28 is a cross-sectional structure view schematically illustrating the manufacturing step of the power semiconductor device according to the third embodiment of the present invention.

FIG. 27 is a cross-sectional structure view schematically illustrating a manufacturing step of the power semiconductor device according to the third embodiment of the present invention. FIG. 28 is a cross-sectional structure view schematically illustrating the manufacturing step of the power semiconductor device according to the third embodiment of the present invention. FIG. 27 illustrates a state where module unit 2 and cooling unit 13 have yet to be bonded together. FIG. 28 illustrates a state where module unit 2 and cooling unit 13 have been bonded together. In the drawings, flow prevention member 11b serves as a flow blocking member in a state where module unit 2 and cooling unit 13 have yet to be bonded together, and resin insulating member 12b serves as a resin insulating member in a state where module unit 2 and cooling unit 13 have yet to be bonded together. Flow prevention reinforcing wall 24 is disposed around flow blocking member 11 (11b), and resin insulating member 12 (12b) is disposed inside flow blocking member 11 (11b).

As described in the first embodiment of the present invention, the pressure that forces resin to flow out from resin insulating member 12 may become an extremely large value on the order of MPa. At this time, when flow blocking member 11 is extremely low in resistance $E_{seal}$ against compression like rubber, only pressure from module unit 2 and heat sink 10 between which flow blocking member 11 is disposed is possibly not enough to resist the pressure that forces resin to flow out from resin insulating member 12. Therefore, in the heat and pressure application step at the time of bonding module unit 2 and cooling unit 13 together, sufficient pressure is applied to resin insulating member 12 to compress resin insulating member 12. If flow prevention reinforcing wall 24 came into contact with the upper surface of heat sink 10 in a state where sufficient pressure has yet to be applied to flow blocking member 11 and resin insulating member 12 to compress flow blocking member 11 and resin insulating member 12, flow prevention reinforcing wall 24 would receive the pressure from the upper surface of module unit 2. Subsequently, pressure is not sufficiently applied to flow blocking member 11 and resin insulating member 12, and voids existing in resin insulating member 12 are not reduced accordingly, which may result in poor pressure resistance.

That is, as illustrated in FIG. 28, it is desirable that a relationship of $t_{seal} > t_w$ is satisfied where $t_{seal}$ represents the height of flow blocking member 11, and $t_w$ represents the height of flow prevention reinforcing wall 24. In other words, flow blocking member 11 is set greater in height than flow prevention reinforcing wall 24. Here, the height of flow blocking member 11 and the height of resin insulating member 12 are approximately equal to each other, but are defined by the height of the adjacent flow blocking member 11 from the viewpoint of case of comparison with the height of flow prevention reinforcing wall 24.

On the other hand, the smaller the gap between flow prevention reinforcing wall 24 and heat sink 10, the higher the scalability against the resin from resin insulating member 12, and it is therefore desirable that the gap be as close to zero as possible within a dimensional tolerance. The height (projection amount) of flow prevention reinforcing wall 24 can be set, for example, in a range of 0.5 to 0.95 times the height (thickness) of resin insulating member 12. Note that when there is a gap between flow prevention reinforcing wall 24 and the upper surface of heat sink 10, flow blocking member 11 may partially flow out toward flow prevention reinforcing wall 24.

As described above, flow prevention reinforcing wall 24 is formed around flow blocking member 11 and on the lower surface of module unit 2, so that even when pressure that forces resin to flow out from resin insulating member 12 is extremely high at the time of bonding module unit 2 and cooling unit 13 together by application of heat and pressure, it is possible to prevent resin insulating member 12 from flowing out while suppressing generation of voids in resin insulating member 12.

Figure 29:
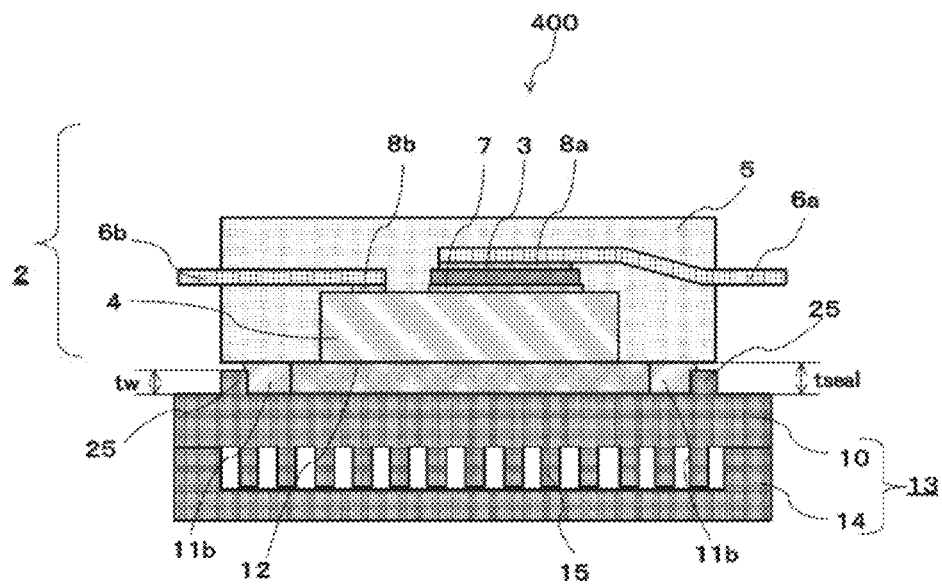
FIG. 29 is a cross-sectional structure view schematically illustrating another type of power semiconductor device according to the third embodiment of the present invention.
Figure 30:
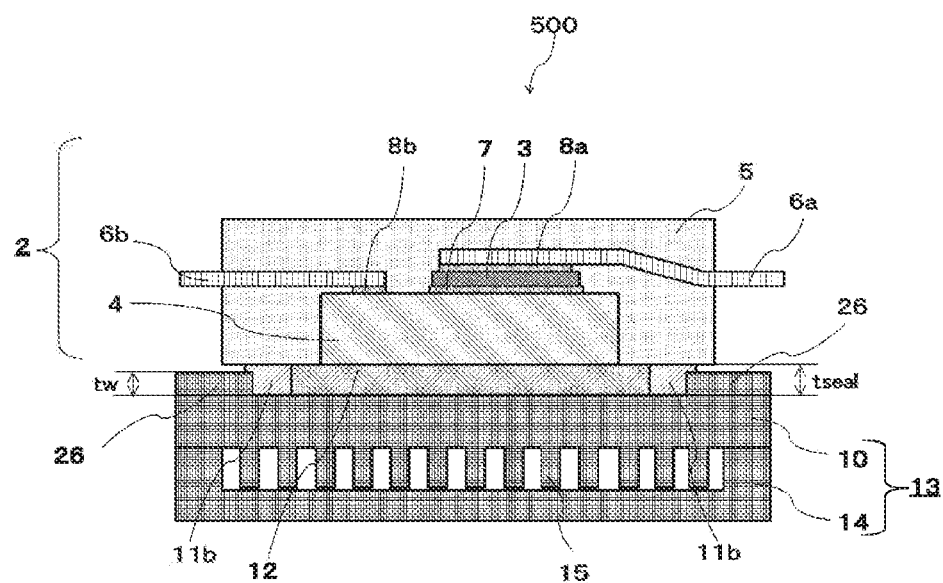
FIG. 30 is a cross-sectional structure view schematically illustrating another type of power semiconductor device according to the third embodiment of the present invention.

FIG. 29 is a cross-sectional structure view schematically illustrating another type of power semiconductor device according to the third embodiment of the present invention. FIG. 30 is a cross-sectional structure view schematically illustrating another type of power semiconductor device according to the third embodiment of the present invention.

In FIG. 29, a power semiconductor device 400 includes module unit 2, cooling unit 13, resin insulating member 12, and flow blocking member 11. Further, module unit 2 includes power semiconductor element 3, electrically conductive member 4 having a plate shape, input/output terminals 6a, 6b, bonding agent 7, a, 8b, and scaling member 5. Further, cooling unit 13 includes heat sink 10, fins 15, and water jacket 14. Heat sink 10 includes flow prevention reinforcing wall 25 disposed around flow blocking member 11 and projecting from the upper surface of heat sink 10 toward the lower surface of module unit 2.

In the drawing, in power semiconductor device 400, module unit 2 and cooling unit 13 are coupled together with resin insulating member 12 interposed therebetween. Flow prevention member 11 is disposed around resin insulating member 12 and between module unit 2 and cooling unit 13 (heat sink 10). Further, around flow blocking member 11, flow prevention reinforcing wall 25 projecting from the upper surface of heat sink 10 toward the lower surface of module unit 2 is disposed. Flow prevention reinforcing wall 25 is inseparable from heat sink 10 and may be formed by machining such as cutting, desirably casting or molding with a die. Note that when there is a gap between flow prevention reinforcing wall 25 and the lower surface of module unit 2, flow blocking member 11 may partially flow out toward flow prevention reinforcing wall 25.

Further, as illustrated in FIG. 30, a center region of the upper surface of heat sink 10 may be hollowed, and the periphery of the hollowed region may be used as flow prevention reinforcing wall 26. Flow prevention reinforcing wall 26 may be formed by machining such as cutting, desirably casting or molding with a die, at the time of making heat sink 10, as with flow prevention reinforcing wall 25 described above.

As described above, flow prevention reinforcing wall 25, 26 is formed around flow blocking member 11 and on the upper surface of heat sink 10, so that even when pressure that forces resin to flow out from resin insulating member 12 is extremely high at the time of bonding module unit 2 and cooling unit 13 together by application of heat and pressure, it is possible to prevent resin insulating member 12 from flowing out while suppressing generation of voids in resin insulating member 12. Further, the relationship among flow prevention reinforcing wall 25, 26, flow blocking member 11 (11*b*), and resin insulating member 12 (12*b*) is the same as the relationship among flow prevention reinforcing wall 24, flow blocking member 11 (11*b*), and resin insulating member 12 (12*b*) described above.

For module unit 2, a structure where the direct lead bonding is applied to main wire bonding has been described, but bonding with a commonly used aluminum (Al) or copper (Cu) wire or other bonding may be applied. Further, module unit 2 is not limited to a unit of a transfer mold type, and only needs to be capable of applying heat and pressure to resin insulating member 12.

As described above, flow prevention reinforcing wall 25, 26 projecting from the upper surface of heat sink 10 is formed around flow blocking member 11, so that even when pressure that forces resin to flow out from resin insulating member 12 is high at the time of bonding module unit 2 and cooling unit 13 together by application of heat and pressure, it is possible to prevent resin insulating member 12 from flowing out while suppressing generation of voids in resin insulating member 12.

Further, for cooling unit 13, a structure where heat sink 10 that is commonly used in on-vehicle power semiconductor devices serves as a part of water-cooled cooling unit 13, but the cooling system is not limited to water-cooling. Furthermore, heat sink 10 and fins 15 may have not only a structure where heat sink 10 and fins 15 are integrally formed, but also a structure and material suitable for their uses.

In power semiconductor device 300, 400, 500 structured as described above, flow blocking member 11 that is mom easily compressively deformable than resin insulating member 12 is disposed around resin insulating member 12, so that even when pressure is applied to module unit 2 and cooling unit 13 to bond module unit 2 and cooling unit 13 together, generation of voids is suppressed in the periphery of resin insulating member 12. This allows an increase in insulation and heat dissipation of the bonding between module unit 2 and cooling unit 13 and an increase in reliability of a power semiconductor device 300, 400, 500.

Further, flow prevention reinforcing wall 24, 25, 26 is formed around flow blocking member 11, so that even when pressure that forces resin to flow from resin insulating member 12 is extremely high at the time of bonding module unit 2 and cooling unit 13 together by application of heat and pressure, it is possible to prevent resin insulating member 12 from flowing out while suppressing generation of voids in resin insulating member 12.

Fourth Embodiment

In the fourth embodiment, the power semiconductor device according to any one of the first to third embodiments is applied to a power conversion device. Although the present invention is not limited to a specific power conversion device, a structure where the present invention is applied to a three-phase inverter will be described below as the fourth embodiment.

Figure 31:
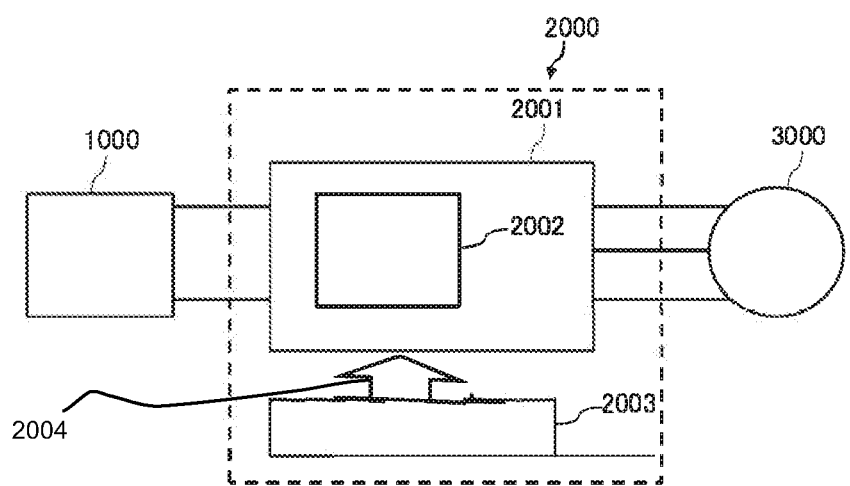
FIG. 31 is a block diagram illustrating a structure of a power conversion system to which a power conversion device according to a fourth embodiment of the present invention is applied.

FIG. 31 is a block diagram illustrating a structure of a power conversion system to which the power conversion device according to the fourth embodiment of the present invention is applied.

The power conversion system illustrated in FIG. 31 includes a power supply 1000, a power conversion device 2000, and a load 3000. Power supply 1000 is a DC power supply and supplies DC power to power conversion device 2000. Power supply 1000 may be made up of various components such as a DC system, a solar cell, and a storage battery, or alternatively, may be made up of a rectifier circuit and AC/DC converter connected to an AC system, and the like. Further, power supply 1000 may be made up of a DC/DC converter that converts DC power output from the DC system into predetermined power.

Power conversion device 2000 is a three-phase inverter connected between power supply 1000 and load 3000, converts DC power supplied from power supply 1000 into AC power, and supplies the AC power to load 3000. As illustrated in FIG. 31, power conversion device 2000 includes a main conversion circuit 2001 that converts DC power input from power supply 1000 into AC power and outputs the AC power, and a control circuit 2003 that outputs, to main conversion circuit 2001, a control signal 2004 to control main conversion circuit 2001.

Load 3000 is a three-phase electric motor driven by the AC power supplied from power conversion device 2000. Note that load 3000 is not limited to a specific application, and is an electric motor mounted on various electric devices such as a hybrid vehicle, an electric vehicle, a railroad car, an elevator, and an air conditioner.

A description will be given below of details of power conversion device 2000. Main conversion circuit 2001 includes a switching element and a freewheeling diode contained in power semiconductor device 2002 (not illustrated), converts DC power supplied from power supply 1000 into AC power by switching the switching element, and supplies the AC power to load 3000. Although there are various specific circuit structures applicable to main conversion circuit 2001, main conversion circuit 2001 according to the present embodiment is a two-level three-phase full bridge circuit and may be made up of six switching elements and six freewheeling diodes each connected in anti-parallel to a corresponding one of switching elements. Main conversion circuit 2001 is made up of power semiconductor device 2002 corresponding to any one of the above-described first to fifth embodiments containing each switching element, each freewheeling diode, and the like. Each two switching elements of the six switching elements are connected in series to constitute upper and lower arms, and each of the upper and lower arms constitutes a corresponding phase (U-phase, V-phase, W-phase) of the full bridge circuit. Output terminals of the upper and lower arms, that is, three output terminals of main conversion circuit 2001, are connected to load 3000.

Main conversion circuit 2001 further includes a drive circuit (not illustrated) that drives each switching element. The drive circuit may be contained in power semiconductor device 2002, or may be separate from power semiconductor device 2002. The drive circuit generates a drive signal to drive each switching element of main conversion circuit 2001 and supplies the drive signal to a control electrode of the switching element of main conversion circuit 2001. Specifically, in accordance with the control signal from control circuit 2003 to be described later, a drive signal to switch the switching element to the ON state or a drive signal to switch the switching element to the OFF state is output to the control electrode of each switching element. When the switching element is kept in the ON state, the drive signal is a voltage signal (ON signal) greater than or equal to a threshold voltage of the switching element, and when the switching element is kept in the OFF state, the drive signal is a voltage signal (OFF signal) less than or equal to the threshold voltage of the switching element.

Control circuit 2003 controls each switching element of main conversion circuit 2001 so as to supply desired power to load 3000. Specifically, a time (ON time) during which each switching element of main conversion circuit 2001 is in the ON state is calculated based on the power to be supplied to load 3000. For example, main conversion circuit 2001 can be controlled by PWM control under which the ON time of the switching element is modulated in a manner that depends on the voltage to be output. Further, a control command (control signal) is output to the drive circuit contained in main conversion circuit 2001 so as to output the ON signal to a switching element to be in the ON state and output the OFF signal to a switching element to be in the OFF state at each time point. The drive circuit outputs the ON signal or the OFF signal as the drive signal to the control electrode of each switching element in accordance with the control signal.

To the power conversion device according to the fourth embodiment structured as described above, the power semiconductor device according to the first to third embodiments is applied as power semiconductor device 2002 of main conversion circuit 2001, which increases reliability.

For the present embodiment, an example where the present invention is applied to a two-level three-phase inverter has been described, but the present invention is not limited to such an example, and may be applied to various power conversion devices. According to the present embodiment, a two-level power conversion device is used, but a three-level or multi-level power conversion device may be used, or alternatively, the present invention may be applied to a single-phase inverter in a case where power is supplied to a single-phase load. Further, in a case where power is supplied to a DC load or the like, the present invention may also be applied to a DC/DC converter, an AC/DC converter, or the like.

Further, the power conversion device to which the present invention is applied is not limited to a power conversion device applied to a case where the above-described load is an electric motor, and may be used as a power supply device applied to, for example, an electric discharge machine, a laser beam machine, an induction heating cooker, or a non-contact power supply system. Alternatively, the power conversion device may be used as a power conditioner applied to a photovoltaic system, a power storage system, or the like.

In particular, when SiC is used as power semiconductor element 3, the power semiconductor element is operated at high temperatures as compared with Si in order to make the best use of the characteristics of SiC. Such a power semiconductor device populated with a SiC device requires higher reliability, so that the advantage of the present invention in that a highly reliable power semiconductor device is provided is more effective.

It should be understood that the above-described embodiments are illustrative in all respects and not restrictive. The scope of the present invention is defined by the claims rather than the above-described embodiments, and the present invention includes all modifications within the scope of the claims and equivalents of the claims. Further, the invention may be made up of a desired combination of the plurality of components disclosed in the above-described embodiments.

REFERENCE SIGNS LIST

2: module unit, 3: power semiconductor element, 4: electrically conductive member, 5: sealing member, 6a, 6b: input/output terminal, 7, 8a, 8b: bonding agent, 10: heat sink, 11, 11b: flow blocking member, 12, 12b: resin insulating member, 13: cooling unit, 14: water jacket, 15: fin, 22, 23: projection, 24, 25, 26: flow prevention reinforcing wall, 31: positioning projection, 32: positioning pin, 33, 34: positioning groove, 41: resin, 100, 200, 201, 300, 400, 500, 2002: power semiconductor device, 1000: power supply, 2000: power conversion device, 2001: main conversion circuit, 2003: control circuit, 3000: load

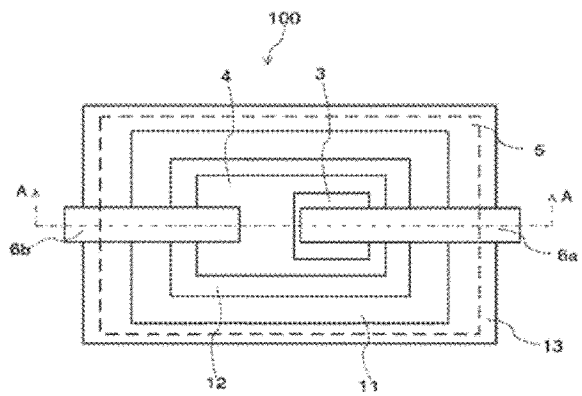
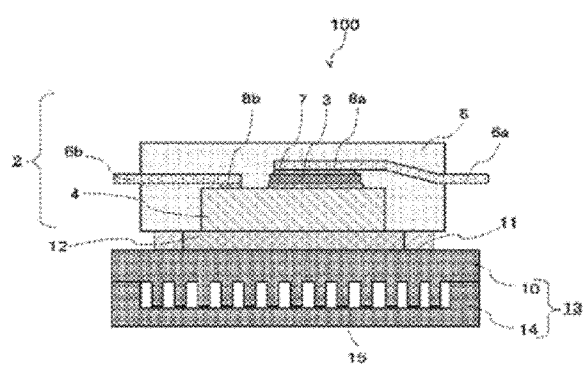

The invention claimed is:

1. A power semiconductor device comprising:
a module unit;
a resin insulating member bonded to the module unit;
a cooling unit coupled to the module unit with the resin insulating member interposed therebetween; and
a flow blocking member disposed between the module unit and the cooling unit to surround the resin insulating member, the flow blocking member being more easily compressively deformable than the resin insulating member, wherein the module unit includes a first projection provided outside the resin insulating member, and the flow blocking member is disposed between the first projection and the cooling unit.

2. The power semiconductor device according to claim 1, wherein the module unit includes a first projection provided outside the resin insulating member, and the flow blocking member is disposed between the first projection and the cooling unit.

3. The power semiconductor device according to claim 1, wherein the cooling unit includes a second projection provided outside the resin insulating member, and the flow blocking member is disposed between the second projection and the module unit.

4. The power semiconductor device according to claim 1, wherein the flow blocking member is made of a wire rod, and an intersection portion or connecting portion of the wire rod disposed around the resin insulating member is located at a corner of the resin insulating member.

5. The power semiconductor device according to claim 4, wherein a plurality of the wire rods are provided.

6. The power semiconductor device according to claim 1, wherein either the module unit or the cooling unit includes a positioning groove for positioning the flow blocking member.

7. The power semiconductor device according to claim 1, wherein either the module unit or the cooling unit includes a flow prevention reinforcing wall provided outside the flow blocking member.

8. The power semiconductor device according to claim 7, wherein the flow blocking member is greater in height than the flow prevention reinforcing wall.

9. The power semiconductor device according to claim 1, wherein the resin insulating member is made of a high thermal conductive member impregnated with resin.

10. The power semiconductor device according to claim 1, wherein the flow blocking member is made of any one of aluminum, indium, tin, an aluminum alloy, an indium alloy, a tin alloy, or rubber.

11. A power conversion device comprising:
    a main conversion circuit including the power semiconductor device according to claim 1, the main conversion circuit to convert and output input power; and
    a control circuit to output, to the main conversion circuit, a control signal to control the main conversion circuit.

12. The power semiconductor device according to claim 1, wherein the flow blocking member has a positioning hole at a position corresponding to a positioning pin on the module unit or the cooling unit.

13. The power semiconductor device according to claim 1, wherein the flow blocking member has a plurality of positioning holes, each of the plurality of positioning holes is arranged at a position corresponding to one of a plurality of positioning pins on the module unit or the cooling unit.

14. The power semiconductor device according to claim 1, wherein the flow blocking member has a circular cross-sectional shape.

15. The power semiconductor device according to claim 1, wherein
    the module unit has an electrically conductive member having a lower surface that is disposed on the upper surface of the cooling unit via the resin insulating member, and a sealing member that seals the electrically conductive member with the lower surface of the electrically conductive member exposed, and
    an upper surface of the flow blocking member is in contact with the lower surface of the sealing member and the flow blocking member is disposed inside the periphery of the sealing member, thereby preventing the resin insulating member from leaking from the upper and lower positions of the flow blocking member.

16. A method for manufacturing a power semiconductor device, the method comprising:
    a module unit forming step of forming a module unit;
    a cooling unit forming step of forming a cooling unit;
    a resin insulating member and flow blocking member disposing step of disposing a resin insulating member and a flow blocking member on the cooling unit to make the resin insulating member surrounded by the flow blocking member, the flow blocking member being more easily compressively deformable than the resin insulating member, wherein the module unit includes a first projection provided outside the resin insulating member, and the flow blocking member is disposed between the first projection and the cooling unit; and
    a cooling unit and module unit bonding step of compressing the resin insulating member and the flow blocking member to bond the cooling unit and the module unit together.

17. The method for manufacturing a power semiconductor device according to claim 16, wherein the resin insulating member and flow blocking member disposing step includes bonding the flow blocking member directly to the cooling unit.

18. The method for manufacturing a power semiconductor device according to claim 16, wherein the resin insulating member and flow blocking member disposing step includes applying the flow blocking member to either the cooling unit or the resin insulating member.

* * * * *

UNITED STATES PATENT AND TRADEMARK OFFICE
CERTIFICATE OF CORRECTION

| | | |
|---|---|---|
| PATENT NO. | : 12,094,798 B2 | |
| APPLICATION NO. | : 17/618886 | |
| DATED | : September 17, 2024 | |
| INVENTOR(S) | : Kobayashi et al. | |

It is certified that error appears in the above-identified patent and that said Letters Patent is hereby corrected as shown below:

On the Title Page

Please delete the Title Page and insert the attached Title Page showing the corrected number of claims.

In the Claims

Replace Column 22, Line 40-Column 24, Line 42, (approx.) with the following:

1. A power semiconductor device comprising:
a module unit;
a resin insulating member bonded to the module unit;
a cooling unit coupled to the module unit with the resin insulating member interposed therebetween; and
a flow blocking member disposed between the module unit and the cooling unit to surround the resin insulating member, the flow blocking member being more easily compressively deformable than the resin insulating member, wherein the module unit includes a first projection provided outside the resin insulating member, and
the flow blocking member is disposed between the first projection and the cooling unit.

2. The power semiconductor device according to claim 1, wherein the cooling unit includes a second projection provided outside the resin insulating member, and the flow blocking member is disposed between the second projection and the module unit.

3. The power semiconductor device according to claim 1, wherein the flow blocking member is made of a wire rod, and an intersection portion or connecting portion of the wire rod disposed around the resin insulating member is located at a corner of the resin insulating member.

4. The power semiconductor device according to claim 3, wherein a plurality of the wire rods are provided.

Signed and Sealed this
Ninth Day of December, 2025

John A. Squires
*Director of the United States Patent and Trademark Office*

5. The power semiconductor device according to claim 1, wherein either the module unit or the cooling unit includes a positioning groove for positioning the flow blocking member.

6. The power semiconductor device according to claim 1, wherein either the module unit or the cooling unit includes a flow prevention reinforcing wall provided outside the flow blocking member.

7. The power semiconductor device according to claim 6, wherein the flow blocking member is greater in height than the flow prevention reinforcing wall.

8. The power semiconductor device according to claim 1, wherein the resin insulating member is made of a high thermal conductive member impregnated with resin.

9. The power semiconductor device according to claim 1, wherein the flow blocking member is made of any one of aluminum, indium, tin, an aluminum alloy, an indium alloy, a tin alloy, or rubber.

10. A method for manufacturing a power semiconductor device, the method comprising:
a module unit forming step of forming a module unit;
a cooling unit forming step of forming a cooling unit;
a resin insulating member and flow blocking member disposing step of disposing a resin insulating member and a flow blocking member on the cooling unit to make the resin insulating member surrounded by the flow blocking member, the flow blocking member being more easily compressively deformable than the resin insulating member, wherein the module unit includes a first projection provided outside the resin insulating member, and the flow blocking member is disposed between the first projection and the cooling unit; and
a cooling unit and module unit bonding step of compressing the resin insulating member and the flow blocking member to bond the cooling unit and the module unit together.

11. The method for manufacturing a power semiconductor device according to claim 10, wherein the resin insulating member and flow blocking member disposing step includes bonding the flow blocking member directly to the cooling unit.

12. The method for manufacturing a power semiconductor device according to claim 10, wherein the resin insulating member and flow blocking member disposing step includes applying the flow blocking member to either the cooling unit or the resin insulating member.

13. A power conversion device comprising:
a main conversion circuit including the power semiconductor device according to claim 1, the main conversion circuit to convert and output input power; and
a control circuit to output, to the main conversion circuit, a control signal to control the main conversion circuit.

14. The power semiconductor device according to claim 1, wherein the flow blocking member has a positioning hole at a position corresponding to a positioning pin on the module unit or the cooling unit.
15. The power semiconductor device according to claim 1, wherein the flow blocking member has a plurality of positioning holes, each of the plurality of positioning holes is arranged at a position corresponding to one of a plurality of positioning pins on the module unit or the cooling unit.

16. The power semiconductor device according to claim 1, wherein the flow blocking member has a circular cross-sectional shape.

17. The power semiconductor device according to claim 1, wherein
the module unit has an electrically conductive member having a lower surface that is disposed on the upper surface of the cooling unit via the resin insulating member, and a sealing member that seals the electrically conductive member with the lower surface of the electrically conductive member exposed, and
an upper surface of the flow blocking member is in contact with the lower surface of the sealing member and the flow blocking member is disposed inside the periphery of the sealing member, thereby preventing the resin insulating member from leaking from the upper and lower positions of the flow blocking member.

(12) United States Patent
Kobayashi et al.

(10) Patent No.: US 12,094,798 B2
(45) Date of Patent: Sep. 17, 2024

(54) POWER SEMICONDUCTOR DEVICE INCLUDING A DEFORMABLE FLOW BLOCKING MEMBER BETWEEN A MODULE UNIT AND A COOLING UNIT

(71) Applicant: Mitsubishi Electric Corporation, Tokyo (JP)

(72) Inventors: Hiroshi Kobayashi, Tokyo (JP); Tomohisa Yamane, Tokyo (JP); Shinnosuke Soda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 235 days.

(21) Appl. No.: 17/618,886

(22) PCT Filed: Aug. 26, 2019

(86) PCT No.: PCT/JP2019/033313
§ 371 (c)(1),
(2) Date: Dec. 14, 2021

(87) PCT Pub. No.: WO2021/038688
PCT Pub. Date: Mar. 4, 2021

(65) Prior Publication Data
US 2022/0359336 A1    Nov. 10, 2022

(51) Int. Cl.
*H01L 23/367*    (2006.01)
*H01L 21/02*    (2006.01)
(Continued)

(52) U.S. Cl.
CPC ........ *H01L 23/36* (2013.01); *H01L 21/02304* (2013.01); *H01L 23/10* (2013.01);
(Continued)

(58) Field of Classification Search
CPC ... H01L 21/02304; H01L 23/36; H01L 23/10; H01L 23/3142; H01L 23/367;
(Continued)

(56) References Cited

U.S. PATENT DOCUMENTS

2005/0230816 A1* 10/2005 Kurauchi ............ H01L 23/4334
257/E23.092
2013/0270684 A1* 10/2013 Negishi .................. H01L 24/27
174/257
(Continued)

FOREIGN PATENT DOCUMENTS

DE   11 2019 007 574 T5   1/2022
JP     2012-174965 A      9/2012
(Continued)

OTHER PUBLICATIONS

International Search Report and Written Opinion mailed on Nov. 12, 2019, received for PCT Application PCT/JP2019/033313, Filed on Aug. 26, 2019, 6 pages including English Translation.
German Office Action issued Feb. 23, 2024, in corresponding German Patent Application No. 11 2019 007 669.8, 16pp.

*Primary Examiner* — Alonzo Chambliss
(74) *Attorney, Agent, or Firm* — XSENSUS LLP

(57) ABSTRACT

Provided is a semiconductor device that prevents resin from leaking out from a resin insulating member at a periphery of the resin insulating member and thereby achieves an increase in reliability. The semiconductor device includes a module unit, a resin insulating member bonded to the module unit, a cooling unit coupled to the module unit with the resin insulating member interposed therebetween, and a flow blocking member disposed between the module unit and the cooling unit to surround the resin insulating member, the flow blocking member being more easily compressively deformable than the resin insulating member.

17 Claims, 14 Drawing Sheets